United States Patent
Wurster et al.

(10) Patent No.: US 6,509,599 B1
(45) Date of Patent: Jan. 21, 2003

(54) TRENCH CAPACITOR WITH INSULATION COLLAR AND METHOD FOR PRODUCING THE TRENCH CAPACITOR

(75) Inventors: Kai Wurster, Dresden (DE); Martin Schrems, Langebrück (DE); Jürgen Faul, Radebeul (DE); Klaus-Dieter Morhard, Dresden (DE); Alexandra Lamprecht, Dresden (DE); Odile Dequiedt, Dresden (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/232,081

(22) Filed: Jan. 15, 1999

(30) Foreign Application Priority Data

Jun. 15, 1998 (EP) .............................. 98110933

(51) Int. Cl.$^7$ ............................................ H01L 27/108
(52) U.S. Cl. ....................................... 257/301; 257/304
(58) Field of Search .................................. 257/301, 304

(56) References Cited

U.S. PATENT DOCUMENTS

| | | | |
|---|---|---|---|
| 4,937,205 A | | 6/1990 | Nakayama et al. .......... 437/165 |
| 5,187,550 A | | 2/1993 | Yanagisawa ................ 257/301 |
| 5,250,829 A | * | 10/1993 | Bronner et al. ............. 257/301 |
| 5,336,912 A | | 8/1994 | Ohtsuki ...................... 257/304 |
| 5,344,381 A | | 9/1994 | Cabrera ....................... 494/56 |
| 5,360,758 A | | 11/1994 | Bronner et al. ............... 437/52 |
| 5,363,327 A | * | 11/1994 | Henkles et al. .............. 257/301 |
| 5,670,805 A | * | 9/1997 | Hammerl et al. ........... 257/301 |
| 6,008,103 A | * | 12/1999 | Hoepfner .................... 438/246 |
| 6,040,213 A | * | 3/2000 | Canale et al. ............... 438/243 |

FOREIGN PATENT DOCUMENTS

EP  0621632 A1  10/1994

OTHER PUBLICATIONS

"Journal of the Electrochemical Society", vol. 141, No. 5, May 1994, pp. 1378–1381.
"Journal of the Electrochemical Society", vol, 136, No. 10, Oct. 1989, pp. 3033–3043.
"0.228$\mu$m$^2$ Trench Cell Technology with Bottle–Shaped Capacitor for 1 Gbit DRAMS", IEDEM 95, pp. 661–664.

* cited by examiner

*Primary Examiner*—Mark V. Prenty
(74) *Attorney, Agent, or Firm*—Laurence A. Greenberg; Werner H. Stemer; Ralph E. Locher

(57) ABSTRACT

A trench capacitor, in particular for use in a semiconductor memory cell, has a trench formed in a substrate; an insulation collar formed in an upper region of the trench; an optional buried plate in the substrate region serving as a first capacitor plate; a dielectric layer lining the lower region of the trench and the insulation collar as a capacitor dielectric; a conductive second filling material filled into the trench as a second capacitor plate; and a buried contact underneath the surface of the substrate. The substrate has, underneath its surface in the region of the buried contact, a doped region introduced by implantation, plasma doping and/or vapor phase deposition. A tunnel layer, in particular an oxide, nitride or oxinitride layer, is preferably formed at the interface of the buried contact.

5 Claims, 16 Drawing Sheets

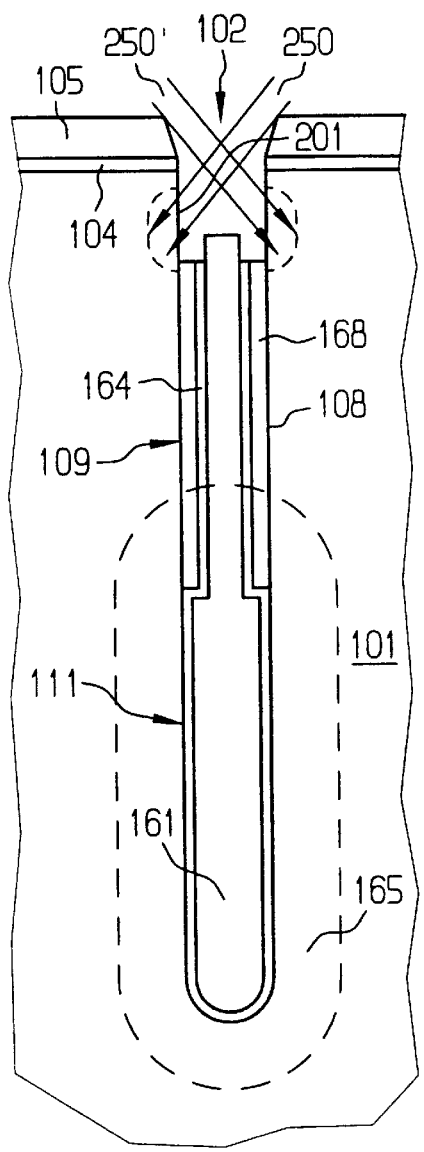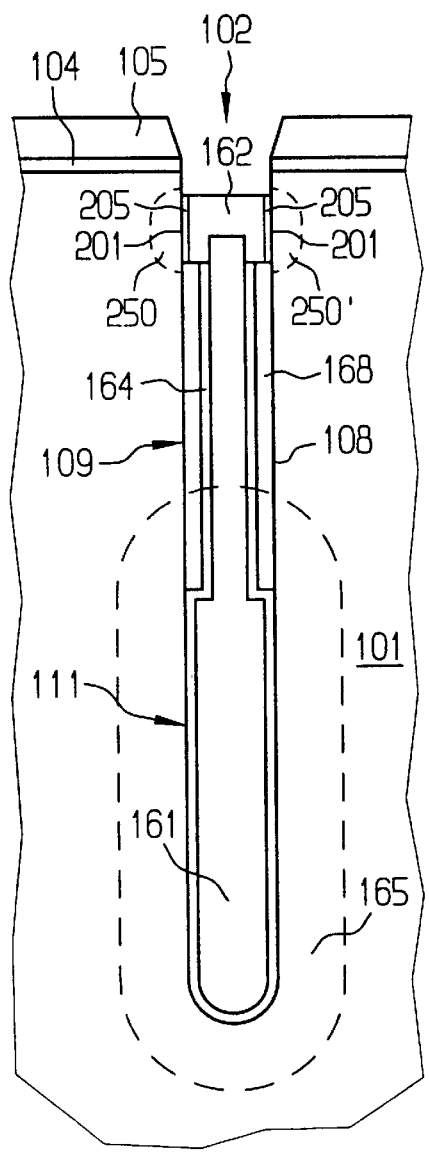

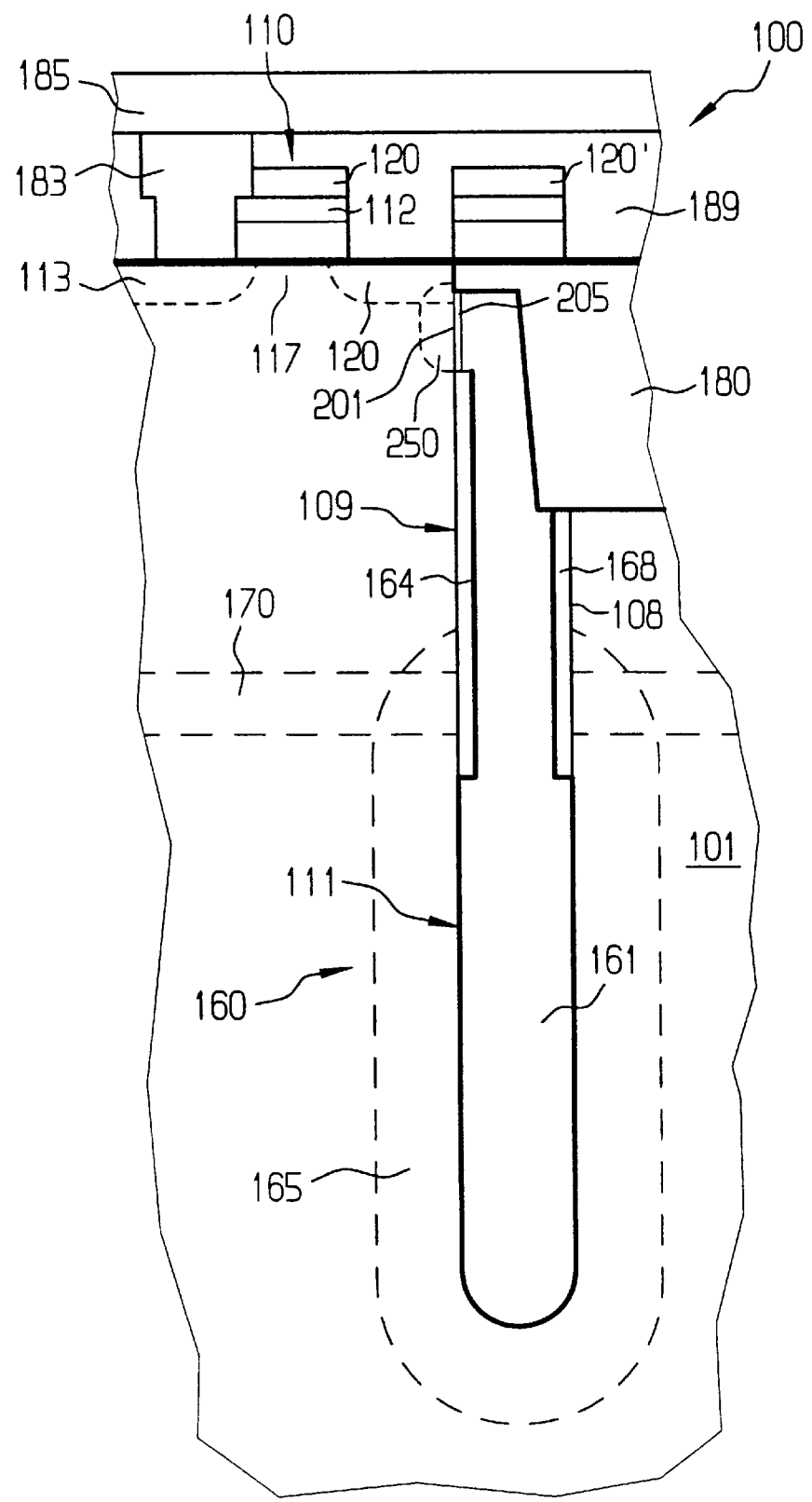

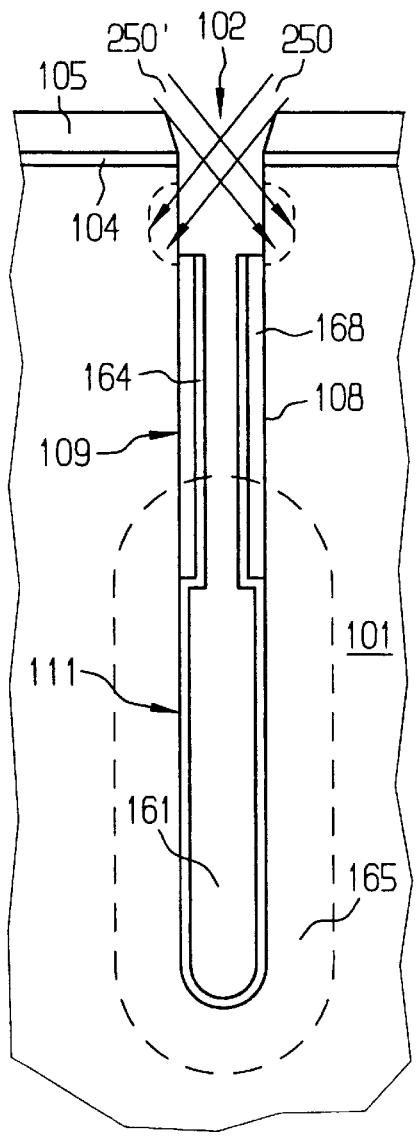
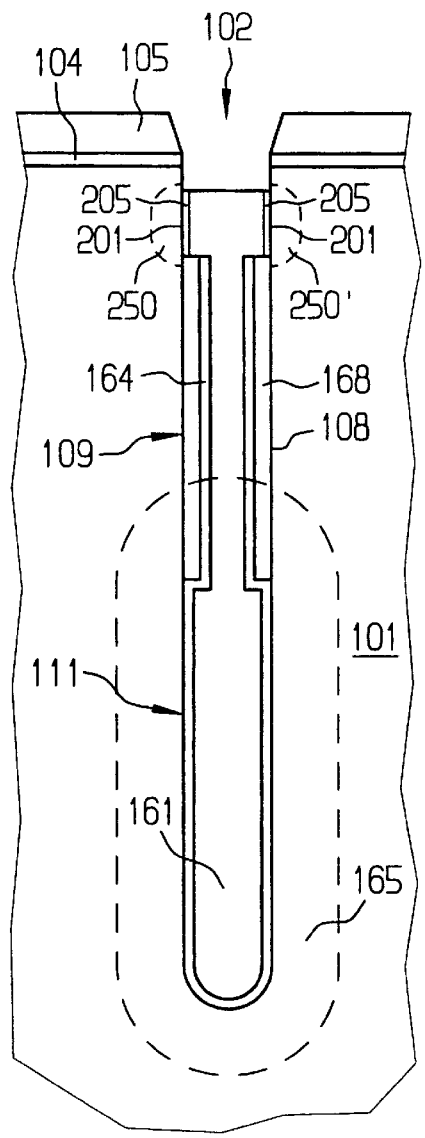

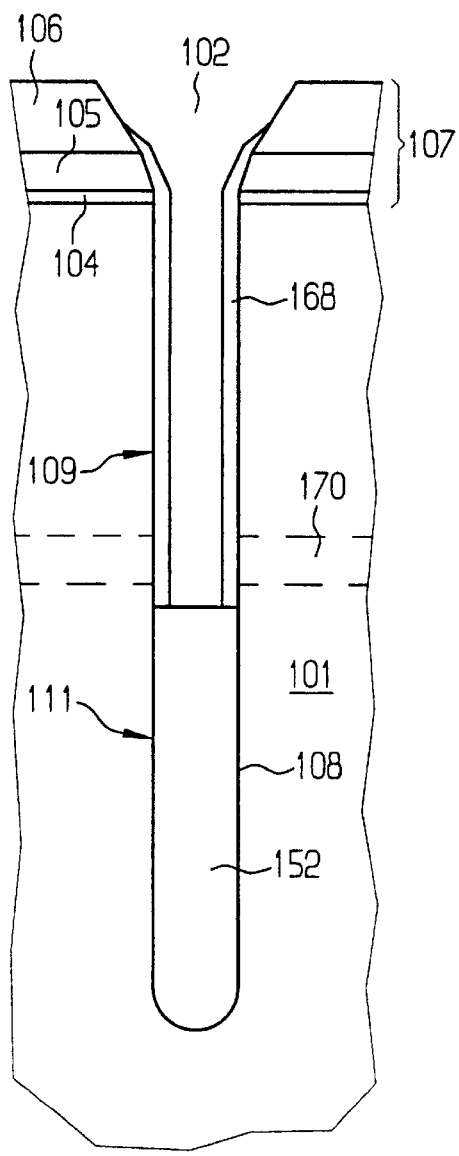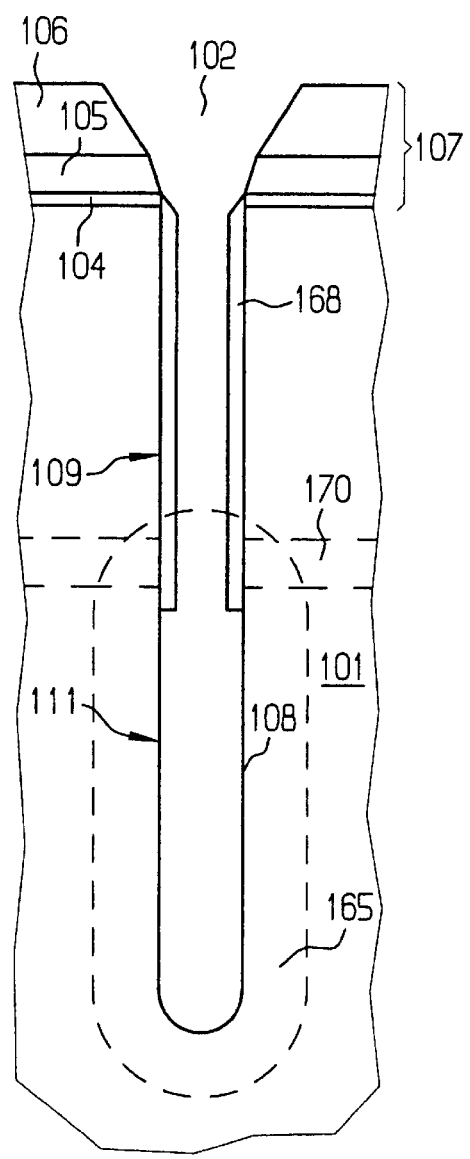

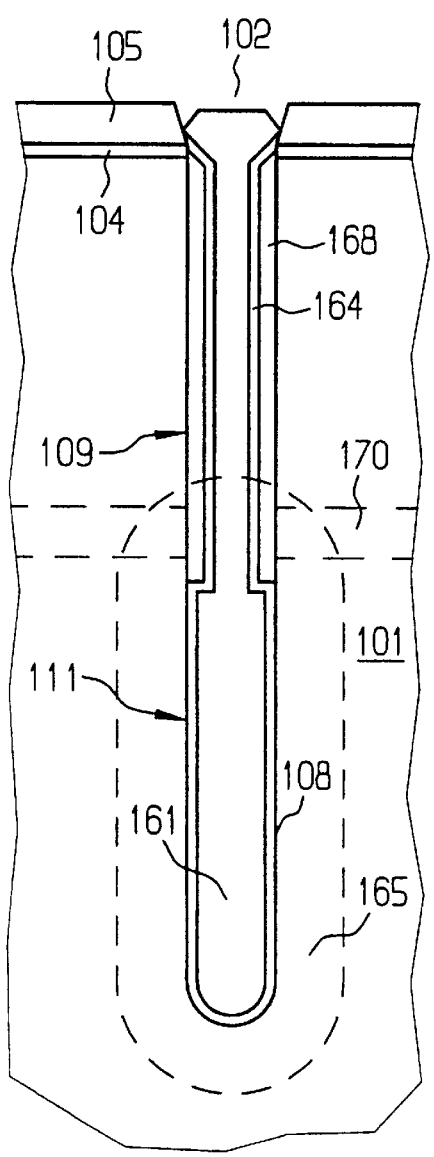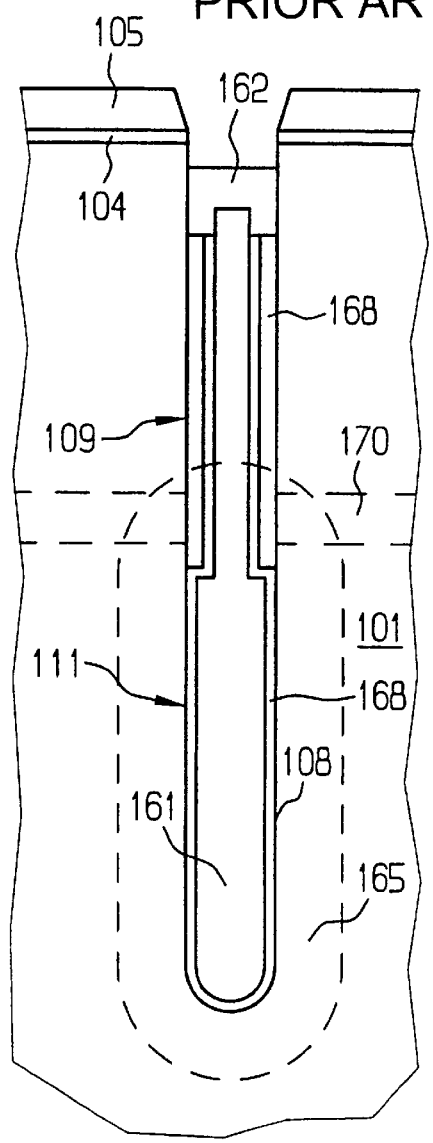

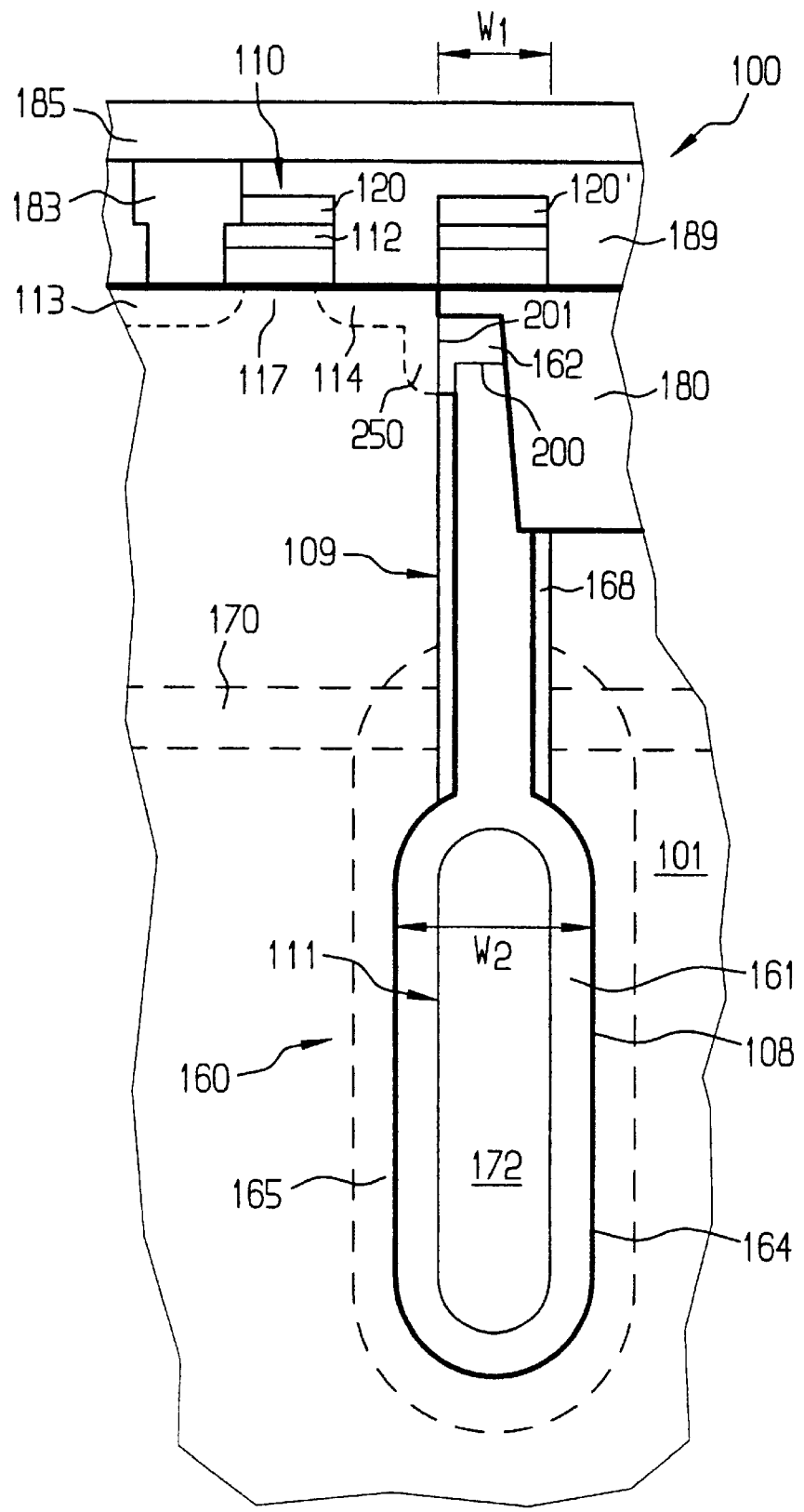

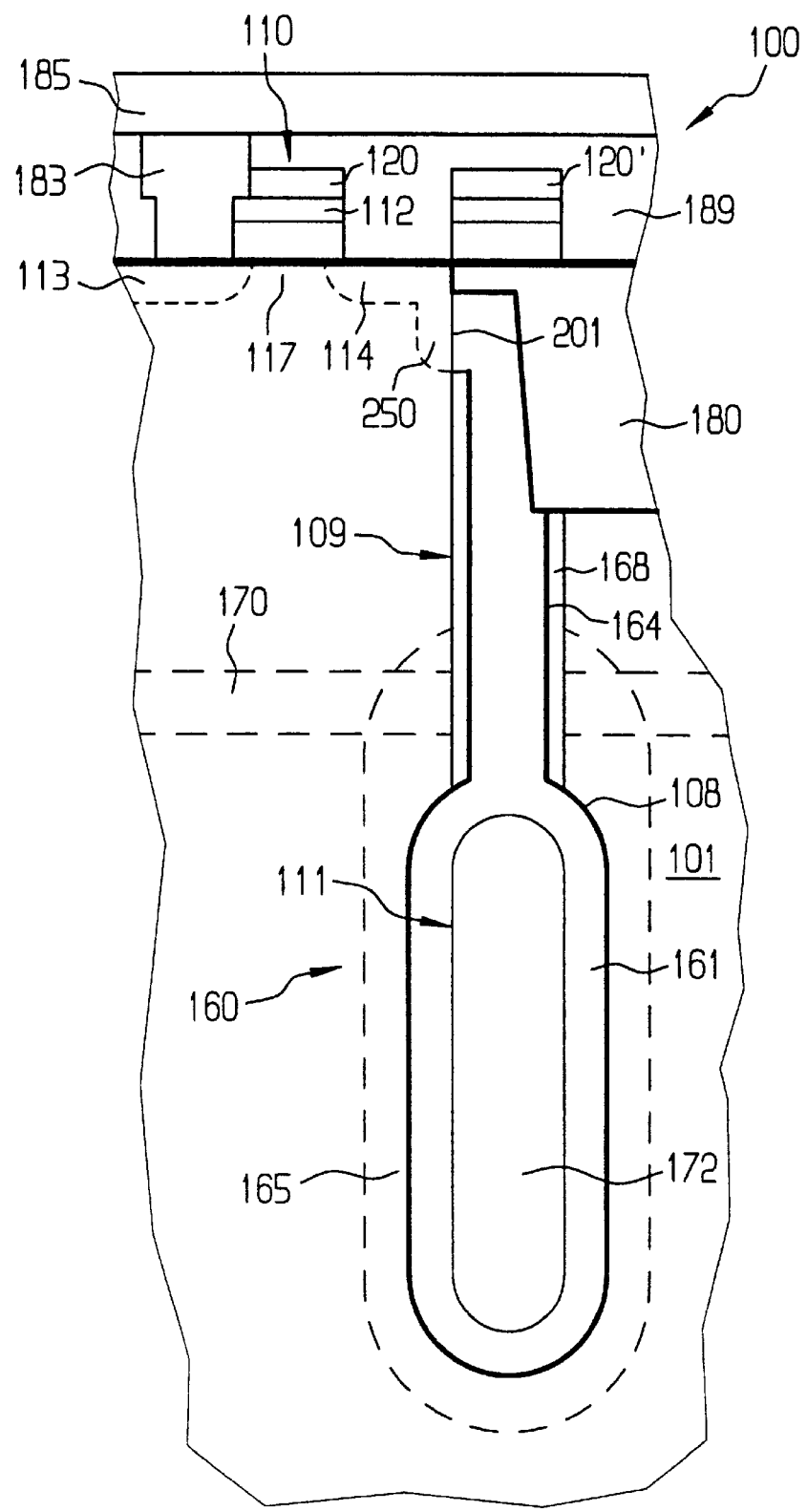

TRENCH CAPACITOR WITH INSULATION COLLAR AND METHOD FOR PRODUCING THE TRENCH CAPACITOR

BACKGROUND OF THE INVENTION

FIELD OF THE INVENTION

The invention relates to a trench capacitor having an insulation collar and a corresponding method of producing such a trench capacitor.

The invention of the instant application as well as the underlying problems will be explained with regard to a trench capacitor used in a DRAM memory cell. However, the invention is applicable to any type of trench capacitor. Memory cells are used in integrated circuits (ICs), such as, for example, random access memories (RAMs), dynamic RAMs (DRAMs), synchronous DRAMs (SDRAMs), static RAMs (SRAMs), and read-only memories (ROMs). Other integrated circuits contain logic devices, such as, for example, programmable logic arrays (PLAs), application-specific ICs (ASICs), mixed logic/memory ICs (embedded DRAMs), or other circuit devices. Usually a number of ICs will be produced in parallel on a semiconductor substrate, such as, for example, a silicon wafer. After processing the wafer, the wafer is divided up in order to separate the ICs into a number of individual chips. The chips are then packaged into end products, for instance for use in consumer products such as, for example, computer systems, cellular telephones, personal digital assistants (PDAs) and other products. For discussion purposes, the invention will be described with regard to forming an individual memory cell.

Integrated circuits (ICs) or chips use capacitors for storing electrical charges. One example of an IC, which uses capacitors to store charges, is a memory IC, such as, for example, a chip for a dynamic read/write memory with random access (DRAM). In this case, the charge state ("0" or "1") in the capacitor represents a data bit.

A DRAM chip contains a matrix of memory cells which are connected in the form of rows and columns. The row connections are usually referred to as word lines and the column connections as bit lines. Reading data from the memory cells or writing data into the memory cells is realized by activating suitable word lines and bit lines.

A DRAM memory cell usually contains a transistor connected to a capacitor. The transistor contains two diffusion regions separated by a channel above which a gate is arranged. Depending on the direction of the current flow, one diffusion region is referred to as the drain and the other as the source. The designations "drain" and "source" are used mutually interchangeably here with regard to the diffusion regions. The gates are connected to a word line, and one of the diffusion regions is connected to a bit line. The other diffusion region is connected to the capacitor. Applying a suitable voltage to the gate switches the transistor on. This enables a current flow between the diffusion regions through the channel in order to thus form a connection between the capacitor and the bit line. Switching the transistor off disconnects this connection by interrupting the current flow through the channel.

The charge stored in the capacitor decreases with time on account of an inherent leakage current. Before the charge has decreased to an undetermined level (below a threshold value), the storage capacitor must be refreshed.

Ongoing efforts to reduce the size of storage devices promote the design of DRAMs having an increased density and a reduced characteristic size, that is to say a smaller memory cell area. Components, such as capacitors, having a reduced size are used in order to manufacture memory cells, which occupy a smaller surface region. However, the use of smaller capacitors results in a reduced storage capacitance, which, in turn, can adversely affect the functionality and usability of the storage device. For example, sense amplifiers or read amplifiers require a sufficient signal l level for a reliable read-out of the information in the memory cells. The ratio of the storage capacitance to the bit line capacitance is critical in determining the signal level. If the storage capacitance becomes too small, this ratio may be too small to generate a sufficient signal. A smaller storage capacitance also requires a higher refresh frequency.

One type of capacitor that is usually used in DRAMs is a trench capacitor. A trench capacitor has a three-dimensional structure formed in the silicon substrate. An increase in the volume or the capacitance of the trench capacitor can be achieved by etching deeper into the substrate. In this case, the increase in the capacitance of the trench capacitor does not have the effect of enlarging the surface occupied by the memory cell.

A trench capacitor usually, contains a trench etched into the substrate. This trench is typically filled with $n^+$-doped polysilicon, which serves as one capacitor electrode (also referred to as storage capacitor). Optionally, a second capacitor electrode, also referred to as "buried plate", is formed by out-diffusion of $n^+$-dopants from a dopant source into a region of the substrate which surrounds the lower portion of the trench. An $n^+$-doped silicate glass, such as, for example an arsenic-doped silicate glass (ASG), serves as the dopant source in this case. A storage dielectric containing nitride is generally used to insulate the two capacitor electrodes.

A dielectric collar is produced in the upper region of the trench in order to prevent a leakage current from the capacitor connection with the buried plate. The storage dielectric in the upper region of the trench, where the collar is to be formed, is removed before the collar is formed. Removing the nitride prevents a vertical leakage current along the collar.

However, the removal of the upper region of the nitride layer creates pinholes at the transition between the lower part of the collar and the upper part of the storage dielectric. Such pinholes impair the quality of the storage dielectric and are a significant source for the charge dissipation or charge loss from the trench. This reduces the retention time or storage time of the trench capacitor and consequently impairs its functionality.

In order to prevent the format ion of pinholes, a two-stage trench etching process has been proposed. In this case, first of all the trench is partly etched by reactive ion etching (RIE) down to the depth of the collar. The reactive ion etching is selective with respect to the hard mask used for etching. The chemicals generally used for a reactive ion etching comprise for example $N_3/HBr/He/O_2$. An oxide layer is then deposited and etched in such a way that it forms the collar on the trench sidewalls. The reactive ion etching is selective with regard to silicon if, for example, the chemicals $CHF_3/He/O_2$, $CHF_3/Ar$, $C_4F_8/Ar$ or $CF_4$ are used. The remaining region of the trench is etched once the collar has been formed. The storage dielectric is then formed over the collar and the lower region of the trench sidewalls. This method eliminates the need for removing the upper region of the storage dielectric and hence the formation of pinholes.

Although such a two-stage trench formation process is helpful in preventing pinholes, the second reactive ion etching step for removing silicon can cause excessive erosion of the collar. Such an impairment of the collar causes leakage currents. Furthermore, the collar serves as an etching hard mask for the second reactive ion etching step for producing the trench. This creates a lower portion of the trench with a diameter equal to the internal diameter of the collar. Consequently, the lower region of the trench is smaller than the upper region, which has a diameter approximately equal to the external diameter of the collar. This however is undesirable since the capacitance of the capacitor is reduced.

A customary DRAM cell will be described with reference to FIG. 6 and a method for producing the DRAM memory cell according to FIG. 6 will be described with reference to FIGS. 7a–g.

The trench capacitor according to FIG. 6 contains a storage dielectric 164, which is formed in a stepped fashion over the collar 168. This eliminates the need for removing the upper region of the storage dielectric layer and avoids the formation of pinholes at the transition between the collar and the upper edge of the storage dielectric layer. In addition, the lower region of the trench has a width or a diameter $W_2$ which has at least the same magnitude as the width or the diameter $W_1$ of the upper region. Accordingly, it is possible to achieve reduced leakage currents and an increased capacitance.

FIG. 6 shows the trench capacitor 160 implemented in a DRAM memory cell 100. Without restricting the general concept, the DRAM memory cell 100 is a MINT cell (MINT=merged isolation node trench) with a buried strap 162. Other cell configurations, such as, for example, those which use a strap situated on the surface, may also be used. The typical dimensions of a trench 108, which is implemented for example in a 256 Mb DRAM chip using 0.25 μm design rules, are approximately 7–8 μm for depth, with a trench opening of about 0.25 μm times 0.50 μm.

As shown in FIG. 6, the trench capacitor 160 is formed in the substrate 101. The substrate is for instance lightly doped with dopants of a first conductivity type. In this variant, the substrate 101 is lightly doped with p-type dopants (p⁻), such as B, for example. It is however also possible to use a heavily doped p-type substrate (p⁺). It is for instance possible to use epitaxially manufactured p⁺/p⁻-type substrates. Such substrates have a dopant concentration of about $10^{19} cm^{-3}$ with a p⁻-type epitaxial layer having a thickness of typically 2–3 μm. The concentration of B is about $1.5 \times 10^{16} cm^{-3}$. A p-type well (not shown) is provided for insulating the matrix devices. The doping concentration of the p-type wells is about $5 \times 10^{17}$ to $8 \times 10^{17} cm^{-3}$.

In contrast to the above-mentioned customary trench capacitor manufactured by the two-stage trench etching method, the lower region of the trench of this variant, has a width or diameter $W_2$ which is essentially equal to or greater than the width or the diameter $W_1$ of the upper region. Optionally, the buried plate 165 surrounds the lower region of the trench 108. As is shown, the buried plate 165 partly overlaps the upper region of the trench. The buried plate 165 serves as a capacitor electrode. The trench typically contains heavily doped polysilicon 161 with a dopant of a second conductivity type. The polysilicon 161 is for instance heavily doped with n-type dopants (n⁺), such as As or P, for example. In one variant, the polysilicon 161 is heavily doped with As. The concentration of As is about $10^{19}$ to $10^{20} cm^{-3}$.

The storage dielectric layer 164 isolates the capacitor electrodes. In this variant, the storage dielectric 164 lines the inner sidewalls of the collar 168 and the trench sidewalls in the lower region of the trench. The storage dielectric layer includes for example nitride or nitride/oxide. Oxide/nitride/oxide or some other dielectric layer or a stack of dielectric layers, such as, for example, oxide, nitride oxide or NONO, may also be used.

The connection of the buried plate 165 of the capacitor to other capacitors within the DRAM matrix is realized via the buried well 170, which has dopants of the second conductivity type. In the present variant, the buried well 170 is formed by implantation of n-type dopants, such as As or P, for example. The concentration of the buried well 170 is about $1 \times 10^{17} – 1 \times 10^{20} cm^{-3}$. The buried well 170 can also be formed from an n-type epitaxial layer and be connected to a reference voltage. By connecting the buried plates 165 of the capacitors in the DRAM matrix to a common reference voltage, the maximum electric field in the dielectric layer 164 is minimized, which improves reliability. In this variant, the reference voltage has a value in the middle between the L-voltage (Low-voltage) of the bit line and the H-voltage (High-voltage) of the bit line, which usually corresponds to half of the supply voltage or $V_{DD}/2$. Other reference voltages, such as the ground potential, for example, may also be used.

The strap 162 is provided above the doped polysilicon 161. The dopants of the doped polysilicon 161 diffuse out and into, the silicon in order to form the capacitor connection diffusion region 125 or the capacitor connection, which connects the transistor 110 to the capacitor 160.

The collar 168 is formed in the upper region of the trench 108 and extends as far as to the top side of the buried plate 165. As is shown, the collar 168 is slightly recessed from the surface of the substrate 101, in order to accommodate the buried strap 162. The collar 168 is fabricated from a dielectric material. In the present variant, a thermal oxide layer is formed first and a TEOS (tetraethyl orthosilicate) layer is deposited thereon. The collar 168 prevents or reduces the leakage current from the capacitor connection 162 to the buried plate 165. In one variant, the collar has a depth of about 1.2 μm and a thickness of 20 to 90 nm.

The STI (Shallow Trench Isolation) trench 180 is provided in the upper portion of the trench 108 for the purpose of insulating the DRAM cell from other cells in the matrix and for the purpose of preventing strap or bridge formation between adjacent capacitors. As shown, the STI trench 180 overlaps a region of the trench 108 and leaves a remaining region open, with the result that current can flow between the transistor 110 and between the capacitor 160. In the present variant, the STI trench 180 nominally overlaps about half of the trench width. The STI trench prevents or reduces the leakage current from strap to strap. The depth of the STI trench is about 0.25 μm.

The buried strap 162 of this variant has also a polysilicon filling/buried strap interface designated by 200 as well as a buried strap/substrate interface designated by 201, which will be discussed again in more detail in the context of a variant described below.

The transistor 110 includes the gate stack 112 and the drain/source diffusion regions 113 and 114. The diffusion regions 113, 114 have n-type dopants, such as As or P, for example. The diffusion region 114 is connected to the capacitor connection 125. The gate stack 112, which is connected to the word line 120, comprises a polysilicon layer. The polysilicon is typically doped with n- or p-type dopants. A metal silicide layer (not shown) is optionally formed over the polysilicon layer in order to reduce the sheet resistivity of the gate stack 112. The polysilicon and the silicide are often referred to as "polycide(s)".

The gate stack 112 is covered with a nitride layer, which is used as an etching mask for insulating the word line. In addition, a sidewall oxide (not shown) and a lining are used in order to insulate the word line 120. The lining includes nitride, for example, or another suitable material. The lining also serves as an etching stop during the formation of the edgeless contact 183. The edgeless contact provides a connection between the diffusion region 113 and the bit line 185. The dielectric layer 189, which is composed of BPSG (Boron Phosphorus Silicate Glass), for example, or some other dielectric material, such as an oxide, insulates the bit line 185 from the diffusion regions 113, 114.

The word line 120' that runs past is formed above the STI trench 180. The word line 120' that runs past is insulated from the trench 108 by the STI trench 180 and a thick covering oxide. In the present variant, the edges of the word line that runs past are essentially aligned with the trench sidewalls. Such a configuration is referred to as a folded bit line architecture. Further configurations, such as, for example, an open or an open/folded structure, can also be used.

As has been described, the first conductivity type is the p-type and the second conductivity type is the n-type. The invention can also be applied to trench capacitors which have p-type polysilicon formed in an n-type substrate. Furthermore, it is possible for the substrate, the wells, the buried plate and the other elements of the DRAM memory cell to be heavily or lightly doped with impurity atoms in order to obtain the electrical characteristics desired for each case.

Although the first electrical conductivity type is the p-type and the second electrical conductivity type is the n-type, it is also possible to form the DRAM memory cell in an n-type substrate with a trench filled with p-type polysilicon. Furthermore, it is possible to use a vertical transistor or other types of memory cell layouts.

FIGS. 7a–g show a variant of the method for producing the DRAM memory cell according to FIG. 6.

FIG. 7a shows the substrate 101 on which the DRAM memory cell is to be produced. The main surface of the substrate 101 is not critical, and any desired suitable orientation, such as, for example, (100), (110), or (111) can be used. In the present variant, the substrate 101 is lightly doped with p-type dopants (p⁻), such as B, for example. The concentration of B is about $1-2 \times 10^{16}$ cm$^{-3}$.

The substrate 101 contains the n-doped buried well 170. The buried well 170 has P or As as dopant. In the present variant, a mask is patterned in order to define the buried well regions. Dopants of the n-type are then implanted into the buried well regions of the substrate 101. The buried well 170 serves to insulate the p-type well from the substrate 101 and also forms a conductive strap between the buried plates 165 of the capacitors. The concentration and energy of the implantation are approximately $>1 \times 10^{13}$ cm$^{-2}$ at about 1.5 MeV. The buried well 170 may alternatively be formed by implantation and subsequent growth of an epitaxial silicon layer above the substrate surface. This technique is described in U.S. Pat. No. 5,250,829 to Bronner et al.

The substructure stack 107 is formed on the surface of the substrate 101. The substructure stack 107 includes for example the substructure oxide layer 104 and the substructure stop layer 105. The substructure stop layer 105, which serves as polish or etching stop for subsequent processes, includes nitride, for example. Provided above the substructure stop layer 105 is the hard mask layer 106. This hard mask layer 106 includes TEOS. Other materials, such as BSG (Boron Silicate Glass), for example, can likewise be used as the hard mask layer.

In addition, an antireflection coating (ARC) can be used in order to improve the lithographic resolution.

The hard mask layer 106 is patterned or structured using customary photolithographic techniques, in order to define the region 102 in which the trench is to be formed. These steps include the deposition of a photoresist layer and the selective exposure thereof with the desired pattern. The photoresist is then developed and either the exposed or the unexposed regions are removed, depending on whether a positive resist or a negative resist is used. The exposed regions of the substructure stack 107 are then etched down to the surface of the substrate 101. A reactive ion etching step (RIE) then forms the deep trench 108.

A polysilicon semiconductor layer 152 is then deposited over the wafer in order to fill the trench 108. Amorphous silicon may also be used. Further types of material which have a temperature stability up to 1050 to 1100° C. and which can be removed selectively with respect to nitride or oxide may also be used. The polysilicon 152 is referred to as a polysilicon sacrificial layer, since it is subsequently removed. A natural oxide 151, which lines the trench sidewalls, is typically formed before the trench is filled with the polysilicon 152. The oxide layer 151 typically has a thickness of about 0.3–5 nm.

As shown in FIG. 7b, the polysilicon 152 is then removed down to the bottom side of the collar to be formed. The removal of the polysilicon 152 comprises for example, planarization by means of a chemical-mechanical polishing, chemical dry etching (CDE) or reactive ion etching for the purpose of forming a coplanar surface with the top side of the polysilicon in the trench 108 and at the top side of the substructure stack 107. Reactive ion etching is then carried out in order to lower the polysilicon 152 in the trench 108. The use of chemical dry etching to sink or lower the polysilicon 152 in the trench 108 is likewise possible. Preferably, however, the polysilicon 152 is planarized and sunk or lowered in a single step by CDE or RIE, typically by 0.5–2 μm from the substrate surface.

A dielectric layer is then deposited over the wafer, and covers the substructure stack 107 and the trench sidewalls. The dielectric layer is used to form the collar 168. The dielectric layer is made of oxide, for example. In the present variant, the dielectric layer is formed by the growth of a layer of thermal oxide and the subsequent deposition of an oxide layer by chemical vapor phase deposition (CVD), such as, for example, plasma-enhanced CVD (PECVD) or low-pressure CVD (LPCVD), using TEOS. The CVD oxide can be densified by a heat-treatment step. The oxide layer is thick enough to avoid a vertical leakage current, namely 10–50 nm. As an alternative, the dielectric layer can have a layer of thermal oxide.

In another variant, the dielectric layer is formed from CVD oxide. After the CVD oxide has been formed, a heat-treatment step may be carried out in order to densify the oxide. The heat-treatment step is carried out for example in an Ar, $N_2$, $O_2$, $H_2O$, $N_2O$, NO or $NH_3$ atmosphere. An oxidizing atmosphere, such as $O_2$ or $H_2O$, for example, can be used to form a thermal oxide layer under the CVD oxide. Oxygen from the atmosphere then diffuses through the CVD oxide to form a thermal oxide layer on the substrate surface. This advantageously enables the formation of a thermal oxide, if desired, without the need for a thermal oxidation step prior to the deposition of the CVD oxide. The heat-treatment step is typically carried out at a temperature of about 1000–1100° C. and for about 0.5–3 hours.

Furthermore, with reference to FIG. 7b, the dielectric layer is etched by reactive ion etching, for example, in order to form the collar 168. The chemical agents for the reactive ion etching are chosen in such a way that the oxide is etched selectively with respect to the polysilicon 152 and the nitride 106. The reactive ion etching removes the dielectric layer from the surface of the substructure stack and the bottom of the opening. The dielectric layer remains on the silicon sidewall in order to form the collar 168. As illustrated in FIG. 7b, the upper region of the collar 168 is slightly eroded and forms a beveled upper portion.

With reference to FIG. 7c, the polysilicon sacrificial layer 152 is removed from the bottom side of the trench 108. The removal of the polysilicon sacrificial layer 152 is preferably achieved by CDE. The thin natural oxide layer 151 is then typically present on the uncovered trench sidewalls. This thin natural oxide layer 151 can suffice to serve as CDE etching stop. A CDE etching step, for example using $NF_3+Cl_2$ as chemicals, can etch silicon or polysilicon with relatively high selectivity with respect to oxide, which makes it possible to remove the polysilicon using the thin natural oxide layer 151 as an etching stop. By way of example, a selectivity of about 4000:1 was determined for the removal of the polysilicon from the trench 108 using the natural oxide 151 as an etching stop layer.

In another variant, a CDE step with a high $Cl_2$ content is used in order to increase the selectivity of the silicon and/or polysilicon etching with respect to the oxide. A flow rate of about 12 sccm (standard cubic centimeters per minute) results in an effective oxide etching rate of zero, while the polysilicon etching rate is of the order of magnitude of about 2 $\mu$m/min. This enables the natural oxide layer 151 to serve as an efficient etching stop for the removal of the sacrificial polysilicon layer. The thickness of the natural oxide 151 is typically about 0.5 to 1 nm.

As an alternative, wet etching, for example using KOH or $HF:HNO_3:CH_3COOH$, can likewise be used during the removal of the polysilicon. However, the use of KOH may lead to K contamination on the trench sidewall, which may require an additional cleaning step. Reactive ion etching is likewise possible during the removal of the polysilicon since it acts anisotropically. Suitable chemicals for the reactive ion etching for eliminating the polysilicon contain $SF_6/NF_3/HBr$. Other suitable chemicals which etch polysilicon selectively with respect to oxide or nitride are, by way of example, $NF_3/HBr$ or $CF_4/O_2$ or $CF_4/O_2/Cl_2$.

The selectivity of the reactive ion etching regarding poly with respect to oxide or nitride is approximately less than 100:1 on planar surfaces but rises to more than approximately 2000:1 on vertical surfaces, on account of the preferably vertical direction of movement of the ions during the reactive ion etching. On account of the high selectivity of the polysilicon with respect to oxide or nitride on the vertical surfaces, only the upper region of the collar 168 is eroded. This is not a problem, however, since the collar 168 is not eroded below the surface of the substrate.

After the polysilicon has been removed, the buried plate 165 with n-type dopants, such as As or P, for example, is optionally formed as the second capacitor electrode. The collar 168 serves as an insulation mask enabling only the region underneath the collar 168 to be doped. The concentration of the dopants is about $1\times10^{-19}-10^{20}$ cm$^{-3}$. In order to form the buried plate 165, it is possible to use vapor phase doping using $PH_3$ or $AsH_3$, plasma doping, or plasma immersion ion implantation (PIII). Such techniques are described for example in Ransom et al., J. Electrochemical. Soc. Volume 141, No. 5 (1994), pp. 1378 ff., in U.S. Pat. No. 5,344,381, and in U.S. Pat. No. 4,937,205.

Ion implantation using the collar 168 as an insulation mask is also possible. As an alternative, the buried plate 165 can be formed using a doped silicate glass, such as ASG, for example, as a dopant source. The use of doped silicate glass as a dopant source is described for example in Becker et al., J. Electrochemical. Soc., Volume 136 (1989), pp. 3033 ff. If doped silicate glass is used, the layer is removed after the formation of the buried plate.

With reference to FIG. 7d, a storage dielectric layer 164 is deposited on the wafer and covers the surface of the substructure stack 107 and the interior of the trench 108. The storage dielectric layer 164 serves as a storage dielectric for separating the capacitor plates. In one variant, the dielectric layer comprises an NO film stack. The NO film stack is formed by deposition of a nitride layer which is then reoxidized. The nitride layer is formed for example by thermal nitration and CVD nitride with a thickness of about 5 nm.

The nitride layer is for instance reoxidized at a temperature of about 900° C. The reoxidation of the nitride layer marginally increases the thickness of the nitride layer. Further types of dielectric film stacks, such as, for example, oxide-nitride-oxide (ONO) or oxide-nitride-oxide-nitride (ONON),. are also useful. The use of a thin oxide, nitride or nitrated oxide film is also possible.

A further polysilicon layer 161 is deposited on the surface of the wafer for the purpose of filling the trench 108 and for the purpose of covering the substructure stack 107, namely by means of CVD, for example, or other known techniques. As shown, the polysilicon layer 161 is conformal and doped with n-type dopants, such as P and As, for example. In one variant, the polysilicon layer 161 is doped with As. The concentration of As is about $1\times10^{19}-1\times10^{20}$ cm$^{-3}$. The doped polysilicon 161 serves as a capacitor electrode. The layer may alternatively be composed of amorphous silicon. This material can be doped either in situ or sequentially.

With reference to FIG. 7e, the polysilicon layer 161 is sunk for example by a CDE step or by an RIE step using suitable chemicals, such as, for example, $NF_3/Cl_2$ or $NF_3/HBr$ or $SF_6$. In another variant, the polysilicon 161 is lowered to approximately the level of the substructure nitride 106. This advantageously protects the substructure oxide 105 during the subsequent wet etching processes. If the underetching does not constitute a problem, the polysilicon can be lowered as far as the depth of the buried strap.

In accordance with FIG. 7f, the residual storage dielectric layer 164 above the polysilicon 161 is removed by wet etching, using DHF and HF/glycerol, for example. The hard mask layer 106 is then also removed wet-chemically, using BHF. It is also possible to carry out a CDE step for this purpose. The hard mask layer can also be removed earlier in the process sequence, such as, for example, after forming the deep trench 108. As shown, the collar 168 and the dielectric layer 164 are likewise slightly lowered or sunk in the trench 108.

As shown in FIG. 7g, the buried strap 162 is then formed. Forming the buried strap 162 is for example achieved by etching in order to lower or sink the doped polysilicon 161 in the trench. Reactive ion etching is typically used for this purpose. The non-active region of the cell is then defined by a customary photolithographic technique and then anisotropically etched, which is expediently done by reactive ion etching. The non-active region is the region in which the STI trench 180 is to be formed.

As shown in FIG. 6, the STI trench 180 overlaps part of the trench in order to cut off a part of the strap 162. In a subsequent heat-treatment step, dopants from the doped polysilicon 161 diffuse upward and outward through the strap 162 in order to form the diffusion region 125. The depth of the STI trench is about 0.25 μm. Typically the non-active region underneath the top side of the oxide of the collar 168 is etched. In one variant, the non-active region is etched about 0.25 μm below the substrate surface.

After the non-active region has been etched, the photoresist and ARC layers are removed. In order to ensure that no photoresist or ARC residues remain behind, cleaning steps can be used. In order to prevent oxygen from diffusing into the silicon and polysilicon sidewalls an optional lining (not shown) is provided in order to protect the non-active region. The lining comprises nitride, for example. A passivation oxide is typically grown thermally on the uncovered silicon prior to the formation of the nitride lining. The nitride lining is formed by low-pressure chemical vapor deposition (LPCVD), for example.

A dielectric material is formed on the surface of the substrate. The dielectric material includes $SiO_2$, for example. In a further variant, the dielectric material is TEOS. A high-density plasma (HDP) oxide or some other insulation material can be used. The thickness of the dielectric layer suffices to fill the non-active region. Since the dielectric layer is typically conformal, planarization methods, such as chemical mechanical polishing, for example, are employed. Such methods are described for example in Nesbit et al., A 0,6 μm² 256 Mb Trench DRAM Cell with Self-Aligned Buried Strap (BEST), IEDM 93-627. The surface of the substrate 101 is then polished in such a way that the STI trenches 180 and the nitride layer are essentially planar.

The substructure stop layer 105 is then removed by wet chemical etching, for example. The wet chemical etching is selective with respect to oxide. The substructure oxide 104 is likewise removed at this point by wet chemical etching which is selective with respect to silicon. After the removal of the substructure oxide 104, an oxide layer is formed on the surface of the wafer. This oxide layer, which is referred to as a gate sacrificial layer, serves as a screen oxide (scatter oxide) for subsequent implantations.

In order to define a region for a p-type well for the n-channel transistor 110 of the DRAM memory cell, a photoresist layer is deposited on the top side of the oxide layer and suitably patterned in order to uncover the p-type well region. As shown, p-type dopants, such as boron (B), for example, are implanted into the well region. The dopants are implanted to a depth sufficient to prevent punch-through and to reduce the sheet resistivity. The dopant profile is dimensioned in such a way that the desired electrical characteristics are obtained, for example a desired gate threshold voltage ($V_{th}$)

In addition, p-type wells are likewise formed for the n-channel supply circuit configuration. N-type wells are formed for complementary wells in complementary metal oxide silicon devices (CMOS). The production of n-type wells additionally requires photolithographic steps and implantation steps in order to define and form the n-type wells. As in the case of the p-type wells, the profiles of the n-type wells are tailored to achieving the desired electrical characteristics. Once the wells have been formed, the gate sacrificial layer is removed.

The various layers for forming the gate 112 of the transistor 110 are then fabricated. This comprises the formation of a gate oxidation layer, which serves as a gate oxide, a polysilicon layer and a covering nitride layer. The polysilicon layer may typically contain a metal silicide layer, such as $WSi_x$, for example, wherein the thus formed polycide reduces the sheet resistivity. The various gate layers are then patterned in order to form the gate stack 112 of the transistor 110. The sidewall of the gate stack is then insulated by thermal oxidation, for example.

A gate stack that runs past as word line 120' is typically formed above the trench and is insulated from the latter by the STI trench 180. The source/drain diffusion regions 113 and 114 are formed by implantation of n-type dopants, such as P or As, for example. In one variant, P is implanted into the source and drain regions 113, 114. The dose and the energy are selected in such a way that a dopant profile is obtained which ensures the desired operating characteristics. In order to improve the diffusion and the alignment of the source and the drain with the gate, it is possible to use nitride spacers (not shown). The diffusion region 114 is connected to the diffusion region 125 in order to thus form the capacitor connection.

The dielectric layer 189 is formed over the wafer surface, and it covers the gates 112 and the substrate surface. The dielectric layer comprises BPSG, for example. Further dielectric layers, such as TEOS, for example, are also useful. As shown, an edgeless contact opening 183 is etched in order to uncover the diffusion region 113. The contact opening is then filled with a conductive material, such as $n^+$-doped polysilicon, for example, in order to form a contact plug therein. The metal layer 185, which represents a bit line, is formed over the dielectric layer in order to form a contact with the source via the contact plug. Thus the structure shown in FIG. 6 is eventually obtained.

FIG. 8 shows a further example of a customary DRAM cell in accordance with a further variant of a method of producing a memory cell.

As shown therein, the width $W_2$ or diameter of the lower region of the trench capacitor 160 is greater than the width $W_1$ or diameter of the upper region. Increasing $W_1$ increases the capacitance of the capacitor. In order to obtain such a structure, the polysilicon sacrificial layer 152 described in FIG. 7b is eliminated by CDE, for example using $NF_3/Cl_2$. Further chemicals for the selective etching of silicon can also be used. In addition, reactive ion etching using $SF_6$, $NF_3/HBr$ or wet etching using KOH can be used. The lower part of the trench is widened by CDE etching, for example. The widening of the trench is described for example in T. Ozaki et al., 0,228 μm² Trench Cell Technologies with Bottle-shaped Capacitor for 1 Gigabit DRAMs, IEDM 95, pp. 661 or in U.S. Pat. No. 5,336,912 to S. Ohtsuki. The etchant for the CDE etching is selected in such a way that it also removes the thin natural oxide film on the trench sidewalls. This can be achieved by reducing the flow rate of $Cl_2$ in order to lower the selectivity of the etching with respect to the oxide, or by changing the chemicals.

The wet etching or the CDE is controlled in such a way that it removes the sacrificial polysilicon, while it limits the widening in such a way that it does not extend into adjacent trenches or make contact therewith. The widening of the lower region of the trench amounts to about 50% of the minimum spacing between adjacent trenches, preferably less than 20–30% of the minimum spacing between adjacent trenches. Since the spacing between adjacent trenches is typical with respect to the minimum dimension, the widening should be limited to less than 50% of the minimum dimension. This provides, for of example, a bottle-shaped trench whose lower diameter is less than twice the minimum dimension. The widening of the trench preferably amounts to about 20–40% of the minimum dimension.

After the removal of the sacrificial polysilicon and of the etching stop layer, the buried plate 165 may optionally be formed. A variety of techniques for forming the buried plate, such as, for example, vapor phase doping using $AsH_3$ or $PH_3$ at temperatures of about 1000–1100° C., ion implantation of As or P, plasma doping or plasma immersion ion implantation, are also possible. The doped polysilicon is then deposited in order to form the capacitor electrode. The doped polysilicon fills the lower region of the trench, with a cavity 172 being formed. Since the cavity 172 is situated in the lower region of the trench, it does not influence the subsequent processing or functionality of the device. Further techniques for increasing the trench capacitance, such as, for example, the formation of hemispherical silicon grains (HSG) in the trench or the roughening of the trench sidewalls prior to the deposition of the storage dielectric, are also possible.

FIG. 9 shows a further customary DRAM cell in which the trench capacitor 160 has, dictated by the production process, a further interface 202 between the lower part of the trench 108 and the upper part of the trench 108, namely at the bottom side of the collar 168. The further interface 202 originates from a two-stage polysilicon filling process in which firstly the trench is filled with polysilicon, then the latter is lowered or sunk for the purpose of forming the collar and then refilled, after the formation of the collar. A method of this type is described for example in the U.S. Pat. No. 5,360,758 to Bronner et al.

FIG. 10 shows a further customary DRAM cell in accordance with a further variant of a method of producing a memory cell.

As is shown in FIG. 6, in this variant of the DRAM cell there are two internal interfaces 200, 201 for the trench capacitor 160, namely a first interface between the polysilicon filling 161 and the buried strap 162 and a second interface between the buried strap 162 and the capacitor connection diffusion region 125 in the substrate 101.

These two interfaces 200, 201 have an increased electrical resistance and, consequently, slow down the speed in the read/write cycles of the storage device using the DRAM cell. The interface 200 is typically a polysilicon/polysilicon interface, and the interface 201 is typically a silicon single crystal/polysilicon interface.

The variant of a DRAM cell that is shown in FIG. 10 has just one interface 201 between the polysilicon filling 161 and the capacitor connection diffusion region 125 in the substrate 101. The buried strap 162 is not provided in this variant.

Consequently, this variant has a smaller contact resistance between the transistor 110 and the trench capacitor 160, which reduces its susceptibility to failures during the transfer of charge from and to the trench capacitor 160 during read/write cycles and/or enables a higher speed of read/write cycles.

The remaining interface 201 may be a natural oxide (for example 0.3–0.8 nm) from a preceding wet precleaning, or it may be any suitable grown-on or deposited layer, such as, for example, thermal oxide or CVD oxide, oxinitride or nitride, with thicknesses in the range of typically 0.3–2 nm. In-situ precleaning using $H_2$, HF vapor or UHV (Ultra High Vacuum) heat treatment or annealing can also be carried out prior to the formation of the interface 201.

The particular significance of the design of the interface 201 lies in the prevention of uncontrolled recrystallization and defect formation at the interface of the buried contact between transistor 110 and trench capacitor 160. An important advantage of this variant is that there is just a single interface 201 for the buried contact, since the trench is filled after the buried contact region has been defined. Consequently, the resistance for the read/write cycles is much lower, and the process yield is correspondingly better.

FIGS. 11*a–d* show a variant of the method for producing the DRAM memory cell according to FIG. 10.

As shown in FIG. 11*a,* which follows the process stage in accordance with FIG. 7*c,* the hard mask layer 106 is removed, the storage dielectric 164 is applied in the trench 108 and on the substrate surface, and the trench 108 is filled with a sacrificial material 210, in this case with a photoresist, for example.

As illustrated in FIG. 11*b,* as a first step the sacrificial photoresist 210 is sunk by means of CDE etching, and then the upper region of the collar 168 together with the storage dielectric layer 164 situated thereon is sunk in order to define the buried contact at the interface 201 with the substrate 101. This is also done by means of CDE etching which is selective with respect to the sacrificial photoresist 210 and with respect to the substrate 101, or by means of a corresponding wet etching.

An alternative to the sacrificial photoresist is a heavily doped polysilicon layer (n-doped) or amorphous silicon layer which can be etched by means of CDE selectively with respect to oxide, nitride and the as yet undoped interface 201. The advantage of this is that the sinking can be better controlled.

Optionally, the storage dielectric 164 can be removed from the sidewalls of the projecting sacrificial photoresist plug 210 after the sinking of the collar 168.

As shown in FIG. 11*c,* the sacrificial photoresist plug 210 is subsequently removed, namely by CDE etching or wet etching, for example.

With reference to FIG. 11*d,* a precleaning is subsequently carried out by means of an $H_2$ heat treatment or annealing or an HF vapor step or a UHV heat-treatment step. Conventional wet-chemical precleaning (for example BHF or the like) is also possible.

A barrier film is optionally formed on the interface 201, for example a thin oxide or nitride or oxinitride. This is done with or without the precleaning from the previous step, namely in situ, that is to say the wafer is not exposed to the clean room atmosphere in the process.

Polysilicon 161 is then deposited in order to fill the trench 108 and in order to connect the latter to the interface 201 in the upper region of the collar 108. The filling polysilicon 161 is, as mentioned, usually doped with As, P with a concentration of $10^{19}$ cm$^{-3}$–$10^{21}$ cm$^{-3}$. Finally, the filling polysilicon 161 is planarized and sunk e.g. approximately 50 nm below the substrate surface in order to arrive at the process stage shown in FIG. 11*d.* The further process steps are like those described in connection with the variant according to FIG. 7*g.*

FIG. 12 shows a further example of a customary DRAM cell in accordance with a further method variant. By analogy with FIG. 8, the latter variant may also be used for a bottle-shaped trench 108, which is precisely what is illustrated in FIG. 12.

The particular advantages of these latter two variants are that a trench cell with a buried contact is provided which has just one interface, for example polysilicon/single-crystal silicon, whereas usually at least two interfaces are provided.

The particular steps of these two variants are the formation of the collar prior to the deposition of the storage dielectric and the definition of the buried contact by means of a photoresist sinking process. Of course, instead of the resist it is possible to use any other suitable material which can be removed selectively with respect to the collar (oxide), dielectric (nitride) and substrate (silicon), for example As- or P-doped polysilicon, which can be etched by means of CDE selectively with respect to oxide, nitride and undoped or p-doped silicon.

What is problematic in the case of all the known variants referred to, is the formation of the connection of the capacitor at the interface 201 between the capacitor connection diffusion region 125 and the buried strap 162 or the filling polysilicon 161. Any defects or disturbances in this connection region can cause an increased contact resistance and hence errors during read/write cycles.

In order to avoid defects and the associated failures, there is the option of incorporating a boundary layer, such as, for example, a boundary layer made of thermal oxide, nitride, or oxinitride at the interface 201.

If a thin boundary layer is used, it easily ruptures during subsequent thermal processes at typically 1100° C. (for example oxidation after the etching of the STI trenches), which leads to uncontrolled silicon recrystallization and corresponding dislocations at the interface 201. This results in short channel effects or punch-through of the selection transistor (out-diffusion becomes too great) and in an undesired reduction in the retention time.

If a thick boundary layer is used which does not rupture during subsequent thermal processes, it suppresses the out-diffusion and impairs the contacting due to an increased contact resistance and associated errors during the read/write cycles.

Therefore, the customary solution of out-diffusion through the interface 201 is unsatisfactory because the contacting of the selection transistor is difficult to control.

SUMMARY OF THE INVENTION

It is accordingly an object of the invention to provide an improved trench capacitor with an insulation collar which overcomes the above-mentioned disadvantages of the heretofore-known trench capacitors of this general type and which has an improved contact between the trench capacitor and a transistor. A further object of the invention is to provide a method for producing such improved trench capacitors with insulation collars.

With the foregoing and other objects in view there is provided, in accordance with the invention, a trench capacitor, in particular for use in a semiconductor memory cell, comprising a substrate with a trench formed therein, the substrate having a substrate surface, the trench having an upper region and a lower region; an insulation collar formed in the upper region of the trench; a dielectric layer for lining the lower region of the trench and the insulation collar as a capacitor dielectric; a conductive filling material filled in the trench and serving as a capacitor plate; a buried contact beneath the surface of the substrate; and a doped region below the substrate surface in the vicinity of the buried contact, the doped region having dopants introduced by an implantation doping, a plasma doping, and/or a vapor phase deposition.

In accordance with another feature of the invention, a buried plate is provided in the substrate in the vicinity of the lower region of the trench as a further capacitor plate.

In accordance with a further feature of the invention, a strap on the filling material is provided above the insulation collar, the strap being formed of a further filling material.

In accordance with another feature of the invention, the trench is a bottle-shaped trench having a widened region with a cavity formed in the conductive filling material.

In accordance with yet another feature of the invention, the conductive filling material above the insulation collar forms a strap to the buried contact with the substrate.

In accordance with yet a further feature of the invention, the buried contact has an interface with a tunnel layer at the interface, the tunnel layer is an oxide layer, a nitride layer, or an oxinitride layer.

With the foregoing and other objects in view there is also provided, in accordance with the invention, a method for producing a trench capacitor, in particular for use in a semiconductor memory cell, which comprises the steps of providing a substrate; forming a trench with a lower region and an upper region in the substrate; filling the lower region of the trench with a first filling material; forming an insulation collar in the upper region of the trench; removing the first filling material from the lower region of the trench; lining the lower region of the trench and an inner side of the insulation collar with a dielectric layer as a capacitor dielectric; filling the trench with a conductive second filling material as a capacitor plate; providing a buried contact; and introducing a dopant into the substrate in a region underneath a surface of the substrate in the vicinity of the buried contact by implantation, plasma doping, and/or vapor phase deposition.

In accordance with another feature of the invention, a buried plate is formed in the vicinity of the lower region of the trench as a further capacitor plate.

In accordance with yet another feature of the invention, the step of introducing a dopant includes an oblique doping or an isotropic doping through an uncovered interface of the buried contact or through a screen oxide on the interface of the buried contact.

In accordance with a further feature of the invention, a tunnel layer is formed on an interface of the buried contact, wherein the tunnel layer is an oxide layer, a nitride layer, or a oxinitride layer.

In accordance with yet a further feature of the invention, the step of introducing a dopant includes vapor phase doping through an exposed interface of the buried contact with $AsH_3$ or $PH_3$ at 1100° C., 1 min, and 760 Torr.

In accordance with another feature of the invention, a strap to the buried contact is formed above the insulation collar on the conductive second filling material, the strap being made from a third conductive filling material.

In accordance with another feature of the invention, the trench is filled with a fourth filling material being selectively removable with respect to the substrate, the insulation collar, and the dielectric layer, after the steps of forming the insulation collar and lining the lower region of the trench and the inner side of the insulation collar with a dielectric layer; the fourth filling material, the insulation collar, and the dielectric layer are sunk for defining an interface between the buried contact and the substrate; the fourth filling material is removed; and the trench is filled with the conductive second filling material.

In accordance with another feature of the invention, the lower region of the trench is widened relative to the upper region of the trench for forming a bottle shaped trench.

With the foregoing and other objects in view there is also provided, in accordance with the invention, a storage or memory element, in particular a DRAM memory cell, comprising a trench capacitor including a substrate with a trench formed therein, the substrate having a substrate surface, the trench having an upper region and a lower region, an insulation collar formed in the upper region of the trench, a dielectric layer for lining the lower region of the trench and the insulation collar as a capacitor dielectric, a conductive filling material filled in the trench and serving as a capacitor plate, a buried contact beneath the surface of the substrate, and a doped region below the substrate surface in the vicinity of the buried contact, the doped region having dopants introduced by an implantation doping, a plasma doping, and/or a vapor phase deposition; and a selection transistor connected to the trench capacitor via the buried contact.

The trench capacitor in accordance with the invention and the corresponding method for producing such a trench capacitor have the advantage over the known solutions that the resistance at the interface 201 is greatly reduced. In particular, the failures due to varying retention times are reduced and the process yield is increased at the same time. The possibility of reducing the size of the trench cell is enhanced since the contact with the matrix transistor is not carried out by out-diffusion of As and P from the buried strip but rather by direct doping (ion implantation, PLAD or PIII, vapor phase doping). Consequently, the junction depth can be reduced from greater than 100 nm to less than 50 nm at the buried contact between the buried strap 162 and the substrate 101. Short channel effects and punch-through of the selection transistor or matrix transistor can thus be avoided.

The invention is based on the concept of implantation (plasma doping or vapor phase diffusion) through the interface 201 and the formation of an optional thick boundary tunnel layer 205 as tunnel contact which does not rupture during the subsequent process steps and, consequently, does not allow any dislocations to be formed.

A nitride barrier (barrier level 2 eV) is preferable to an oxide barrier (barrier level 3.5 eV) due to the higher tunneling current given the same thickness. The formation of an oxinitride layer with a reduced thickness is also possible.

Nitride or oxinitride can be formed thermally or by means of (LP) CVD deposition or a combination of thermal growth and CVD deposition or CVD deposition with a thermal densification. Other features which are considered as characteristic for the invention are set forth in the appended claims.

Although the invention is illustrated and described herein as embodied in a trench capacitor with insulation collar and a corresponding method for producing a trench capacitor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2a and 2b illustrate process steps of the first method according to the invention for producing the DRAM memory cell of FIG. 1;

FIG. 3 is a cross-sectional partial view of a further exemplary embodiment of a DRAM cell according to the invention corresponding to a second production method according to the invention;

FIGS. 4a and 4b illustrate process steps of the second method according to the invention for producing the DRAM memory cell of FIG. 3;

FIGS. 7a–7g illustrate method steps of a variant of the method for producing the DRAM memory cell of FIG. 6;

FIG. 8 is a cross-sectional partial view of a further example of a customary DRAM cell;

FIG. 12 is a cross-sectional partial view of a further example of a customary DRAM cell.

DESCRIPTION OF THE PREFERRED EMBODIMENTS

Figure 1:
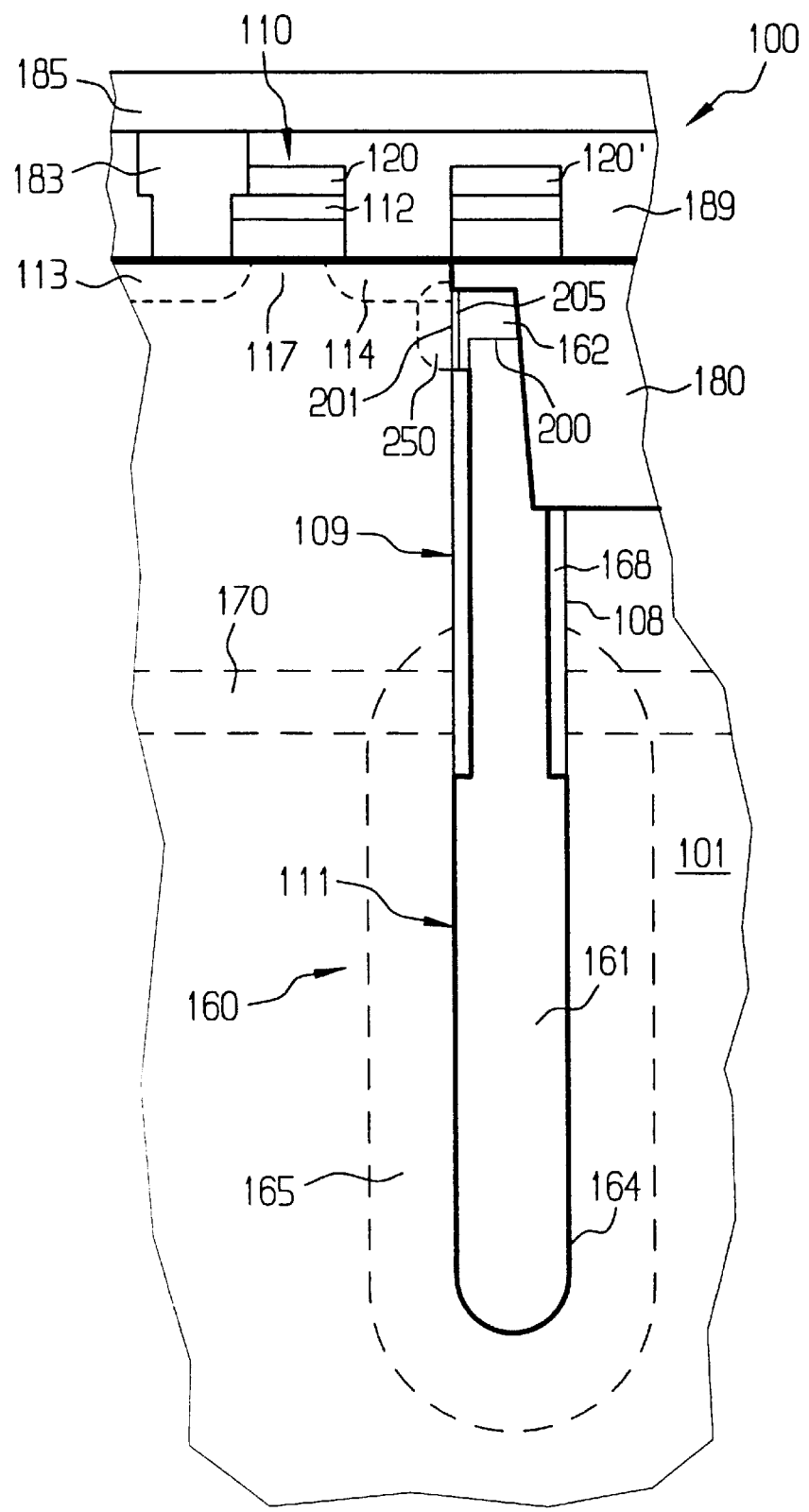
FIG. 1 is a cross-sectional partial view of an exemplary embodiment of a DRAM cell according to the invention corresponding to a first production method according to the invention.

Identical reference numerals designate identical or functionally identical elements in the figures. Referring now to the figures of the drawing in detail and first, particularly, to FIG. 1 thereof, there is shown an exemplary embodiment of a DRAM cell according to the invention in accordance with a first method according to the invention.

As shown in FIG. 1, instead of the capacitor connection diffusion region 125, an implantation region 250 (for example As or P) preferably produced by inclined or oblique implantation, is provided at the interface 201 between the buried strap 162 and the substrate 101 in this exemplary embodiment of the DRAM cell. This implantation region 250 is implemented prior to the growth of the interface layer (for example nitride, oxinitride or oxide). As an alternative, it is possible to use an isotropic doping process such as, for example, plasma doping (PLAD) or plasma immersion ion implantation (PIII) or vapor phase doping instead of the inclined implantation. The PLAD method or the PIII method are preferred since they permit the formation of very shallow junctions or transitions.

An implantation after the formation of the interface layer is also possible. The interface serves as a screening layer in this case.

This embodiment generally enables the reduction of the junction depth of the contact region for the junction between the buried strap 162 and the substrate 101. This is very important for avoiding short channel effects and a punch-through of the relevant matrix device or of the selection transistor.

FIGS. 2a, b show the embodiment of the method according to the invention for producing the DRAM memory cell of FIG. 1.

Figure 7A:
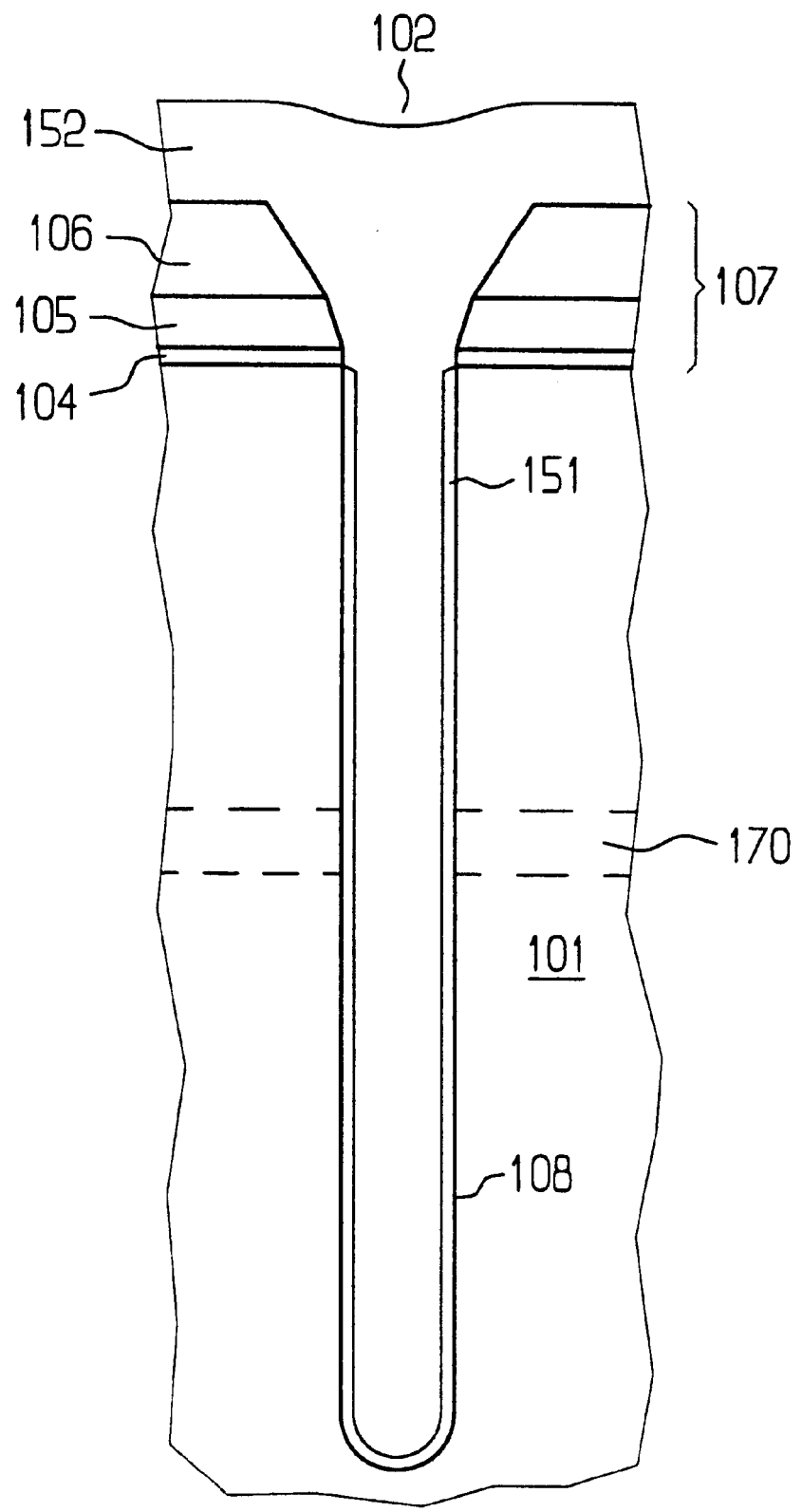
Figure 7D:
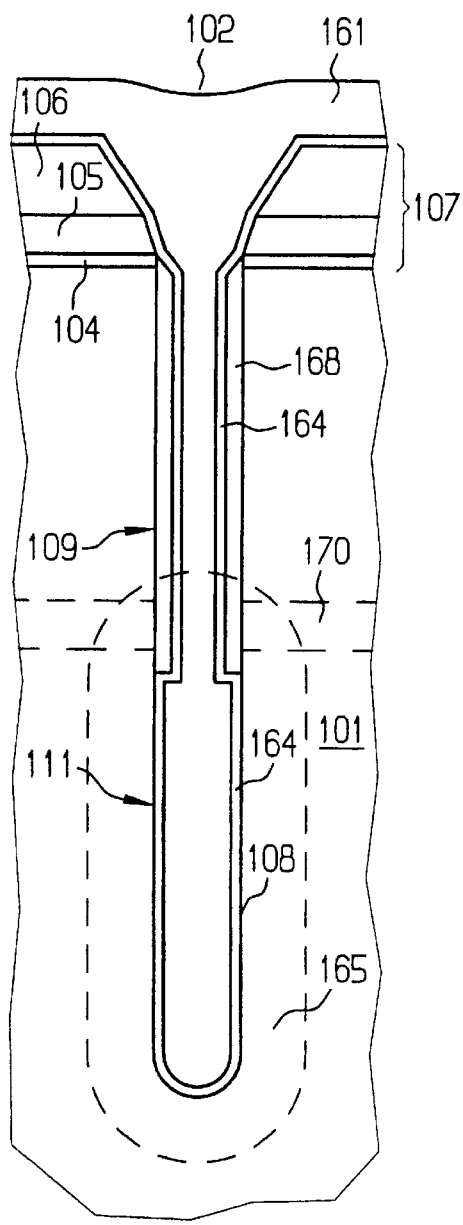
Figure 7E:
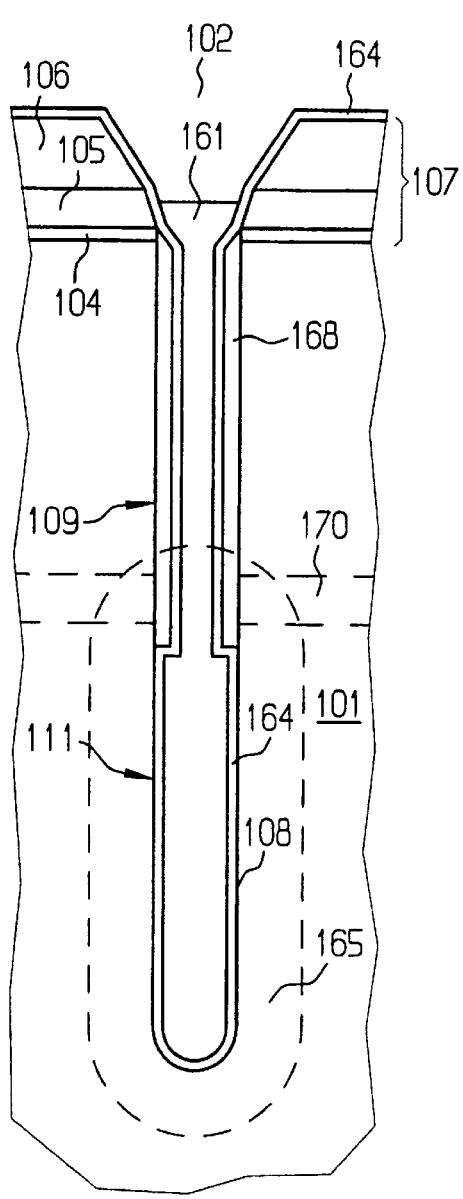

As shown in FIG. 2a, which corresponds to the process stage of FIG. 7e prior to the application of the buried strap 162, after the optional deposition of a screen oxide having a thickness of 5 nm, for example, for the purpose of avoiding damage to the substrate silicon during the implantation, an inclined implantation, for example using As, P or Sb, and preferably using As, is carried out in order to form the implantation region 250 or 250'. The reason for implanting both sides is that, with two trench capacitors 160 provided next to one another, as a rule the left-hand one is connected to the left-hand side of the trench and the right-hand one is connected to the right-hand side of the trench, in which case they share an STI insulation trench 180.

If a screen oxide has been applied, it is subsequently removed by wet etching BHF, for example.

A precleaning is subsequently performed e.g. wet-chemically (DHF, BHF) or in situ ($H_2$ prebake, HF vapor, HF/$NH_3$ vapor, UHV anneal). The interface 201 is then conditioned, for example by the thermal growth of silicon nitride (780° C., 30 minutes, $NH_3$, 1 Torr), silicon oxinitride, or silicon oxide with a thickness in the range of 0.5–2 nm, preferably 0.8–1.5 nm. However, nitride is preferred due to its low barrier level of 2 eV relative to oxide with 3.5 eV for electron tunneling currents.

A (LP) CVD deposition is also possible, however a thermal formation or a combination of CVD deposition and thermal densification is preferred.

As shown in FIG. 2b, the trench 108 is subsequently filled with the polysilicon 161, the latter is planarized and sunk and, finally, the buried strap 162 in the form of polysilicon is formed in situ with As- or P-doping of more than $1\times10^{19}$ $cm^{-3}$. A subsequent doping of the buried strap 162 is also possible.

The method is then continued in the manner described with reference to FIG. 7g.

An isotropic implantation is also possible, wherein the upper end of the sunken polysilicon 161 is also implanted.

Finally, instead of an implantation, it is also possible to carry out a vapor phase doping (for example 900–1100° C., 1 min., 760 Torr using $AsH_3$ or $PH_3$ or 800–1050° C. using $AsH_3$ or $PH_3$ in a vertical oven). This is expediently done without a screen oxide, which would act as a diffusion barrier.

An implantation, PLAD, or PIII enable the formation of particularly shallow regions 250, whereas a vapor phase doping can be carried out in situ and without a screen oxide prior to the formation of the interface layer and thus has the advantage of increasing the productivity.

This embodiment has furthermore the advantage that the resistance at the interface 201 is greatly reduced. In particular, the failures due to a varying retention time are reduced and the process yield is increased at the same time. The possibility of reducing the size of the trench cell is enhanced since the contact with the matrix transistor is not carried out by out-diffusion of As and P from the buried strip but rather by implantation (ion implantation, PLAD or PIII, vapor phase doping). The junction depth can consequently be reduced from greater than 100 nm to less than 50 nm at the buried contact between the buried strap 162 and the substrate 101. Short channel effects and punch-through of the selection transistor and of the parasitic vertical transistor can thus be avoided.

The combination of a sufficiently thick interface or boundary layer 102 for preventing the out-diffusion from the buried strip 162 and the formation of dislocations at the buried strap 162, in combination with a shallow implantation, form a particularly good buried contact between the transistor 110 and the trench capacitor 160.

FIG. 3 shows a further exemplary embodiment of a DRAM cell according to the invention in accordance with a second embodiment of the method according to the invention.

Figure 10:
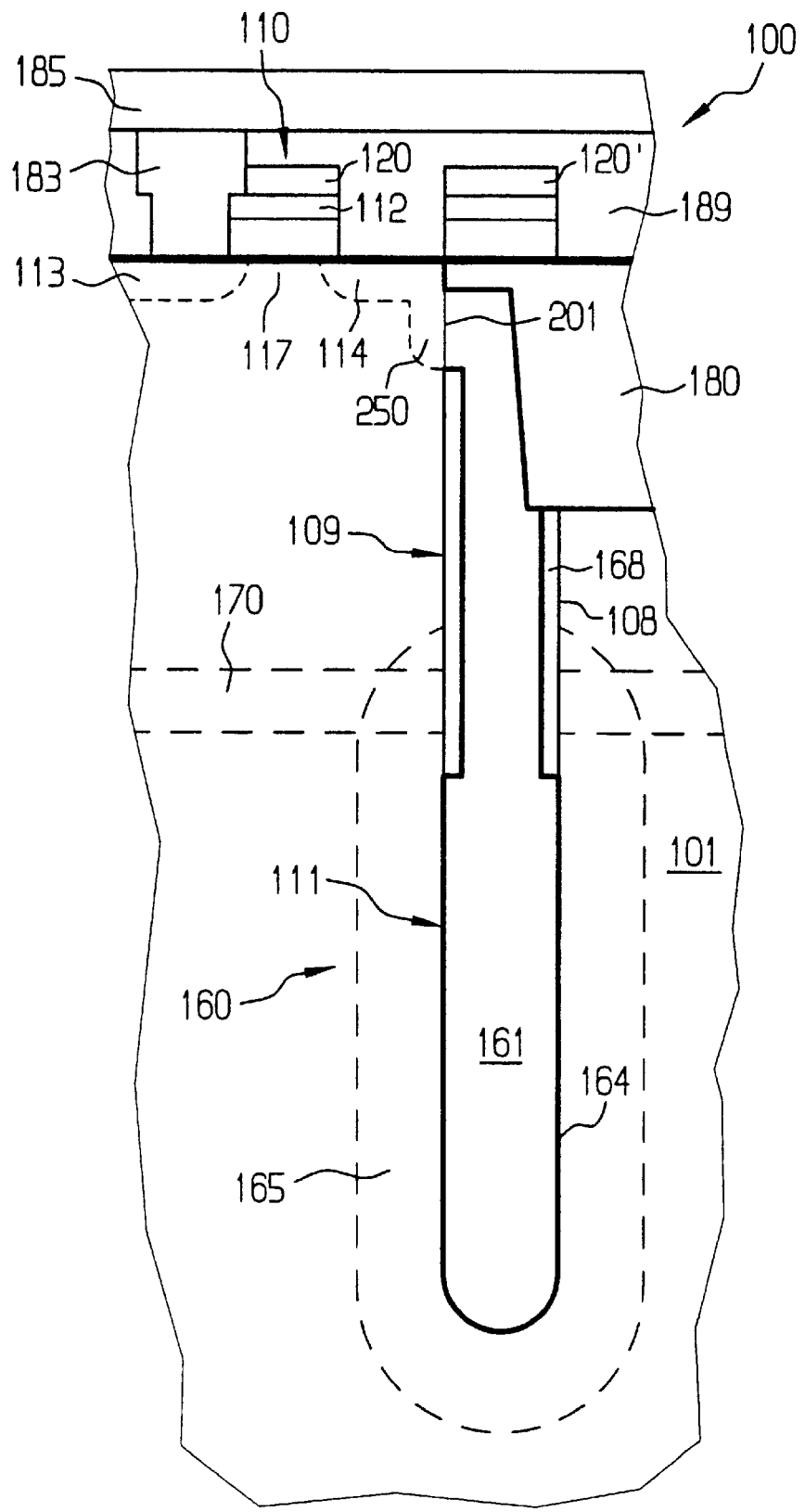
FIG. 10 is a cross-sectional partial view of another exemplary customary DRAM cell.

As illustrated in FIG. 3, the second embodiment is based on the variant shown in FIG. 10. As in the case of the first embodiment, instead of a diffusion region 125 an implantation region 250 is likewise provided.

FIGS. 4a and 4b show the second embodiment of the method according to the invention for producing the DRAM memory cell of FIG. 3.

Figure 11A:
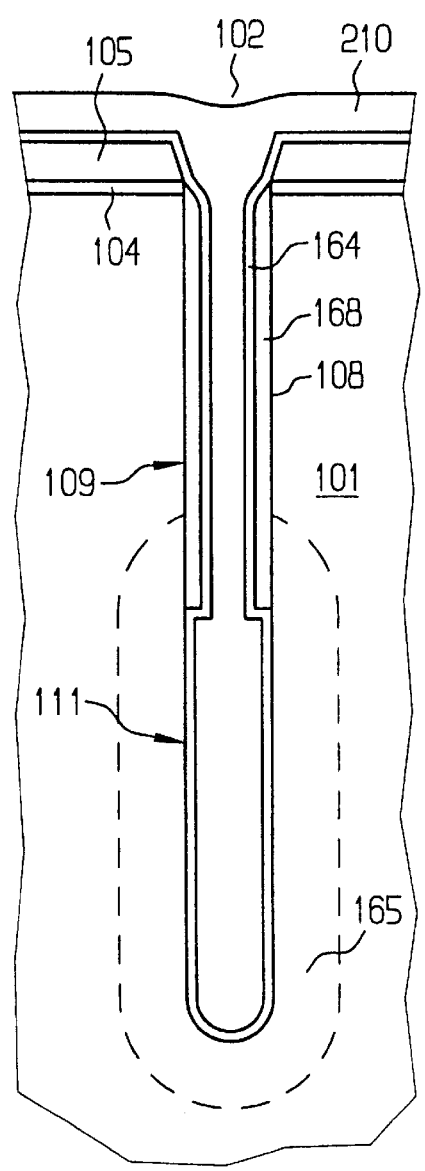
FIGS. 11a–11d illustrate method steps of a variant of the method for producing the DRAM memory cell of FIG. 10.
Figure 11B:
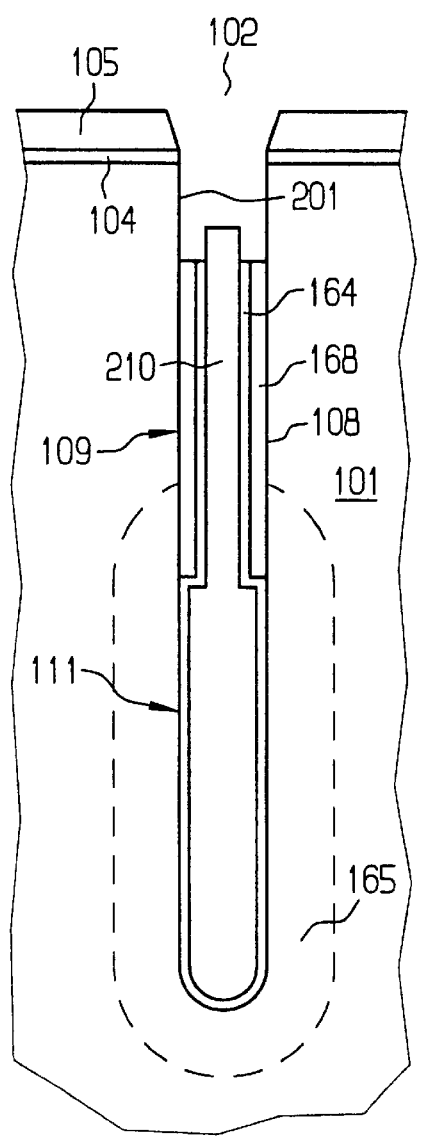
Figure 11C:
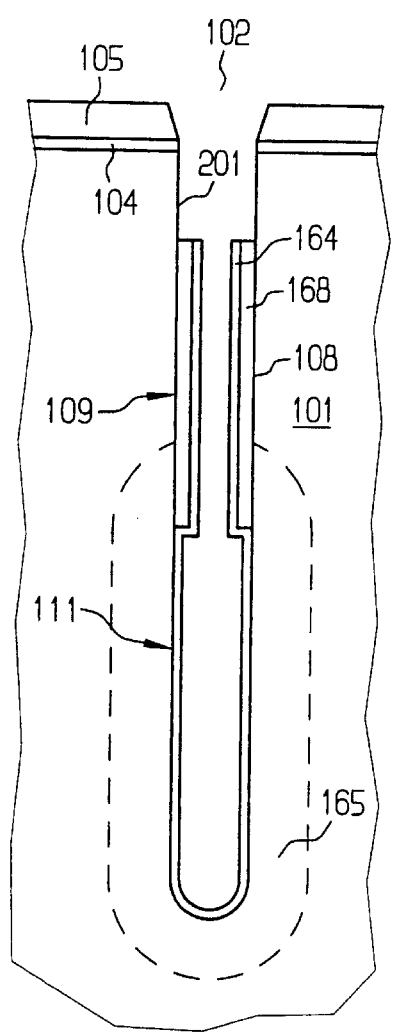
Figure 11D:
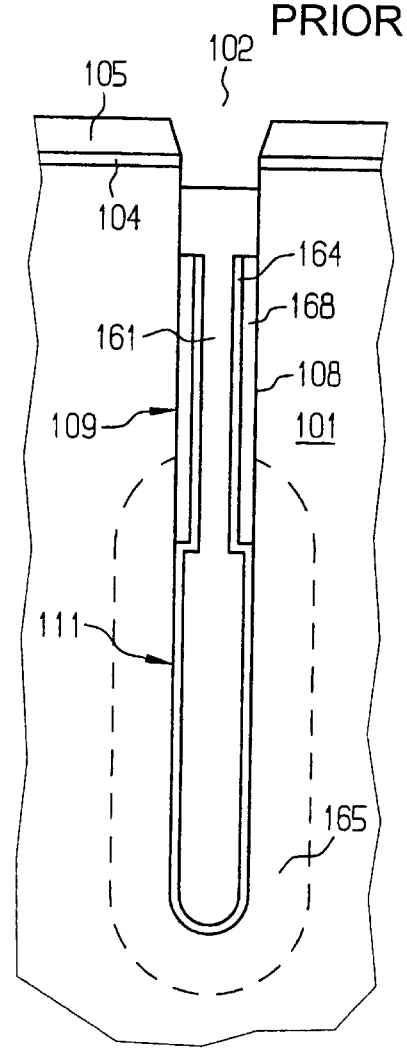

With reference to FIG. 4a, which corresponds to the process stage shown in FIG. 11c, the inclined implantation is carried out in the manner described in connection with the first embodiment. Subsequently, as shown in FIG. 4b, the filling with polysilicon 161 is carried out and the polysilicon is sunk approximately 50 nm below the substrate surface.

The further method steps proceed in the manner described in connection with FIG. 7g.

Figure 9:
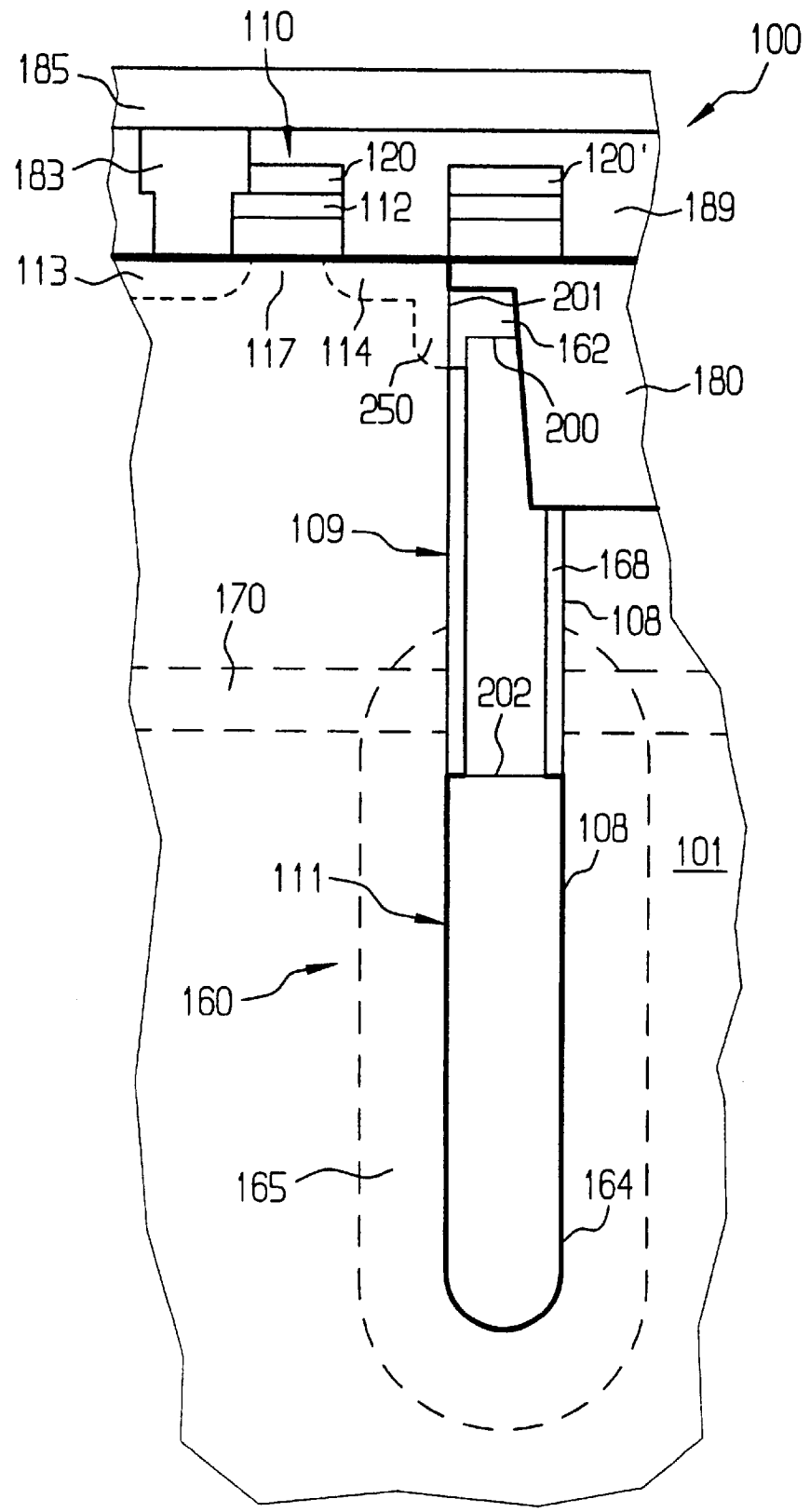
FIG. 9 is a cross-sectional partial view of yet a further example of a customary DRAM cell.

In this context, it is also noted, that the first and second embodiments can also be applied to a trench capacitor which has, dictated by its production method, a further interface 202 between the lower part of the trench 108 and the upper part of the trench 108, namely at the bottom side of the collar 168 (see FIG. 9).

Figure 5:
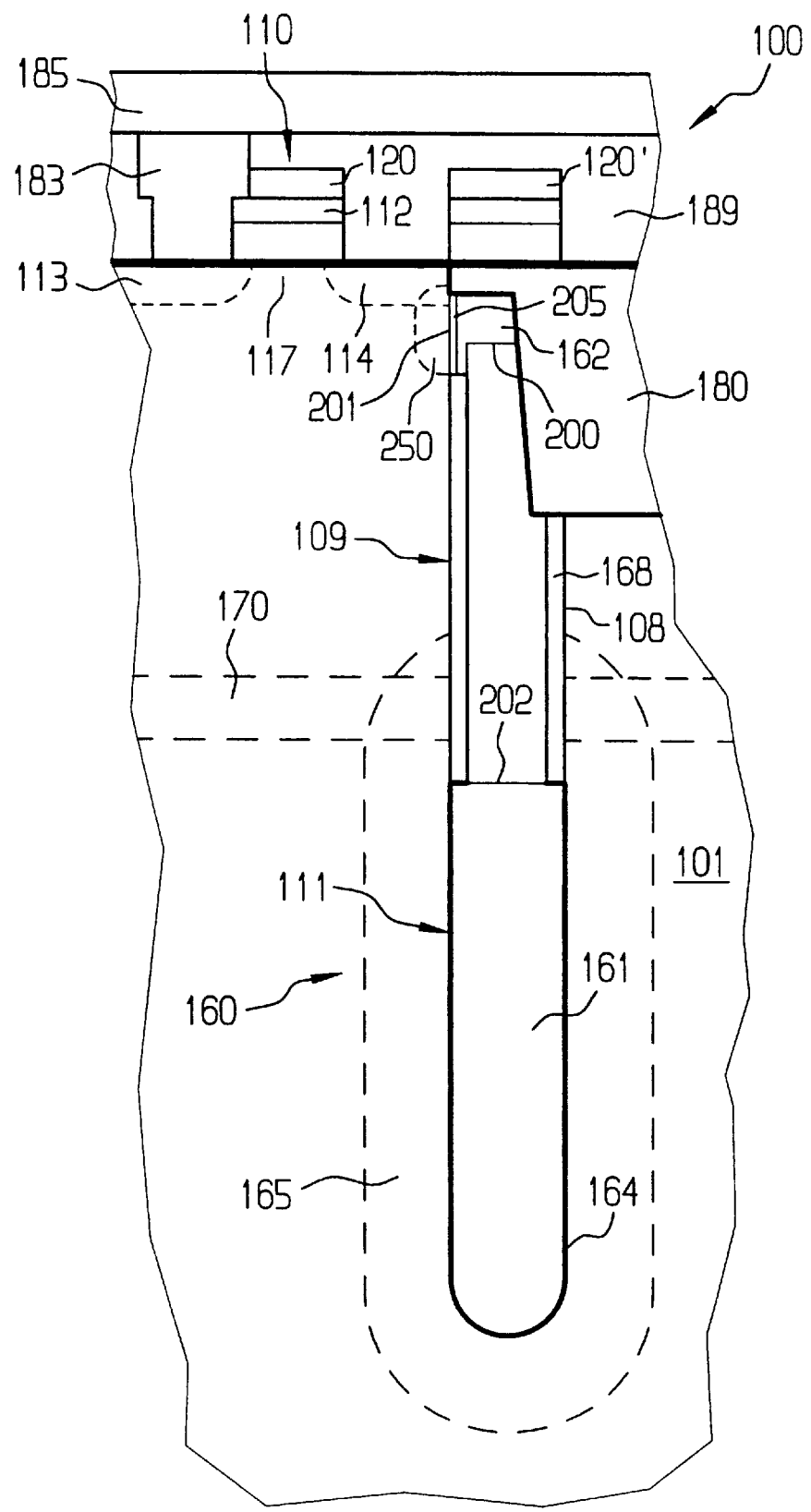
FIG. 5 is a cross-sectional partial view of a further exemplary embodiment of a DRAM cell according to the invention corresponding to a third production method according to the invention.
Figure 6:
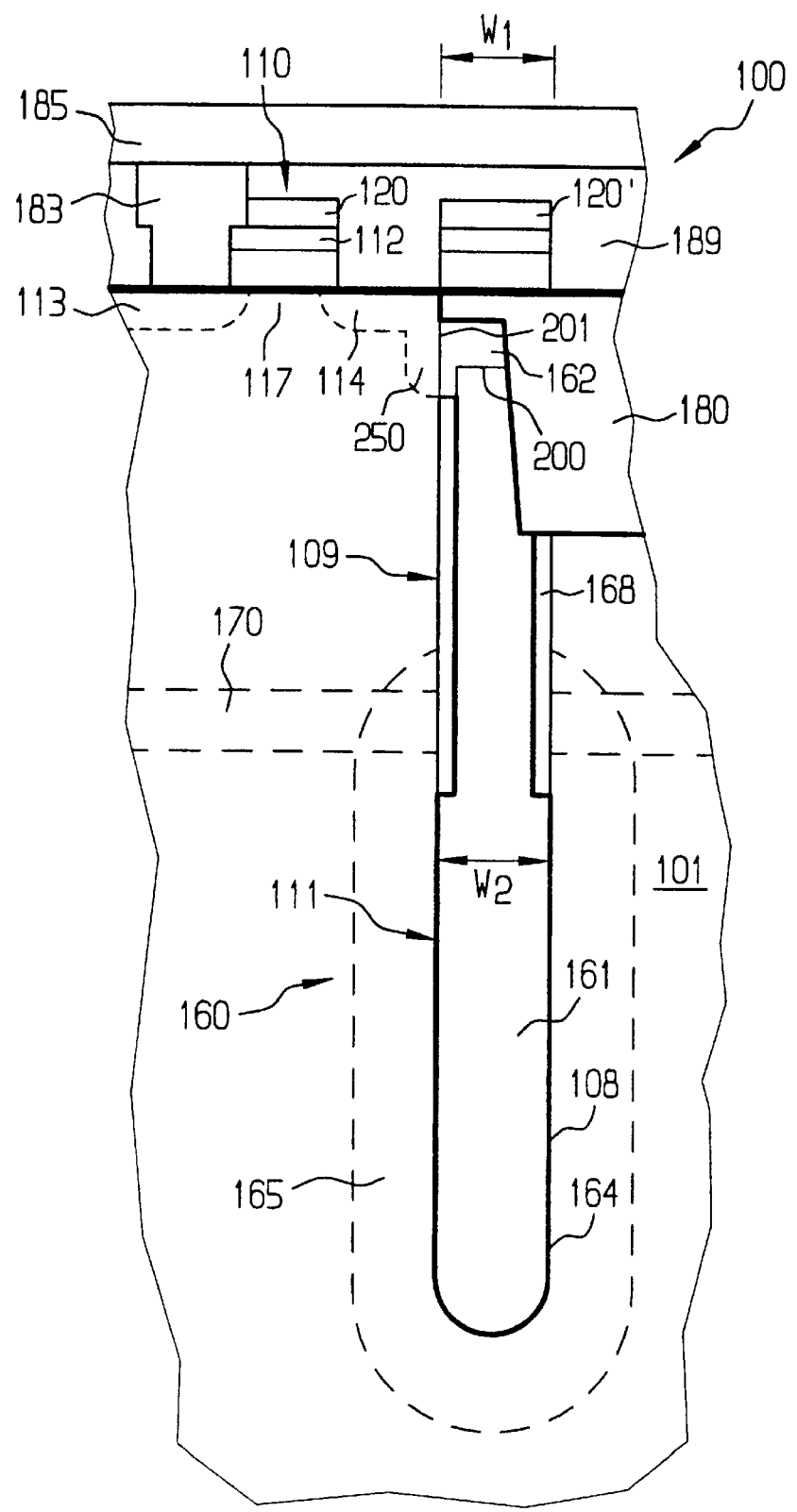
FIG. 6 is a cross-sectional partial view of an exemplary customary DRAM cell.

Such a structure is shown in FIG. 5, which illustrates a further exemplary embodiment of a DRAM cell according to the invention in accordance with a third embodiment of the method according to the invention.

Although the present invention has been described above using preferred exemplary embodiments it is not restricted thereto, but can be modified in many ways.

In particular, the materials referred to are only examples and can be replaced by other materials having suitable properties. The same applies to the cleaning and doping, thermal growth and/or deposition processes mentioned.

Although an oxide, nitride or oxinitride layer have been described as the tunnel layer, any layer which does not rupture during the thermal process steps at typically 1100° C., but permits a highest possible tunneling current, is in principle suitable.

As far as the sequence of process steps is concerned, the embodiments shown may also be combined with one another.

We claim:

1. A trench capacitor, comprising:
   a substrate having a trench formed therein, said substrate having a substrate surface and said trench having an upper region and a lower region;
   an insulation collar formed in said upper region of said trench;
   a dielectric layer lining said lower region of said trench and said insulation collar as a capacitor dielectric;
   a conductive filling material filled in said trench and serving as a capacitor plate;
   a buried contact region for said capacitor plate beneath said surface of said substrate, said buried contact region having dopants introduced by at least one of an implantation doping, a plasma doping, a vapor phase deposition; and
   an interface arranged between a doped region of said buried contact and said filling material, said interface including a tunnel contact layer selected from the group consisting of an oxide layer, a nitride layer, and an oxinitride layer.

2. The trench capacitor according to claim 1, comprising a buried plate in said substrate arranged around said lower region of said trench as a further capacitor plate.

3. The trench capacitor according to claim 1, comprising a strap on said filling material above said insulation collar, said strap formed of a further filling material.

4. The trench capacitor according to claim 1, wherein said trench is a bottle-shaped trench having a widened region with a cavity formed in said conductive filling material.

5. The trench capacitor according to claim 1, wherein said conductive filling material above said insulation collar forms a strap of said buried contact region.

* * * * *